(12) United States Patent
Kang et al.

(10) Patent No.: US 12,457,879 B2
(45) Date of Patent: Oct. 28, 2025

(54) DISPLAY DEVICE AND A MANUFACTURING METHOD OF THE SAME

(71) Applicant: Samsung Display Co., Ltd., Yongin-Si (KR)

(72) Inventors: Ki Nyeng Kang, Yongin-si (KR); Guanghai Jin, Yongin-si (KR); Sunkwang Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/195,975

(22) Filed: May 11, 2023

(65) Prior Publication Data

US 2024/0032378 A1 Jan. 25, 2024

(30) Foreign Application Priority Data

Jul. 19, 2022 (KR) ........................ 10-2022-0088956

(51) Int. Cl.
*H10K 59/40* (2023.01)
*G06F 3/044* (2006.01)
(Continued)

(52) U.S. Cl.
CPC .......... *H10K 59/40* (2023.02); *G06F 3/0446* (2019.05); *H10K 59/1201* (2023.02);
(Continued)

(58) Field of Classification Search
None
See application file for complete search history.

(56) References Cited

U.S. PATENT DOCUMENTS 7,804,242 B2 * 9/2010 Kim .................. H10K 59/1201
313/506
9,040,993 B2 5/2015 You et al.
(Continued)

FOREIGN PATENT DOCUMENTS

KR 10-1560272 10/2015
KR 10-2090703 4/2020
(Continued)

*Primary Examiner* — Patrick N Edouard
*Assistant Examiner* — Peijie Shen
(74) *Attorney, Agent, or Firm* — F. CHAU & ASSOCIATES, LLC

(57) ABSTRACT

A display device including: a display panel including a display region and a non-display region; and an input sensing unit on the display panel and including an active region and a peripheral region, the display panel includes: a base layer; a circuit element layer on the base layer and including a plurality of insulating layers and a voltage line on any of the insulating layers; and a display element layer including a pixel defining film and a light-emitting element, the light-emitting element includes: a first electrode; a second electrode opposite to the first electrode; and an organic layer between the first and second electrodes, the organic layer includes: a first portion overlapping the display region; and a second portion overlapping the non-display region, a first opening is formed in the second portion, and the second electrode and the voltage line are electrically connected to each other through the first opening.

18 Claims, 18 Drawing Sheets

(51) Int. Cl.
  *H10K 59/12* (2023.01)
  *H10K 59/122* (2023.01)
  *H10K 59/131* (2023.01)
  *H10K 71/00* (2023.01)

(52) U.S. Cl.
  CPC ......... *H10K 59/122* (2023.02); *H10K 59/131* (2023.02); *H10K 71/00* (2023.02)

(56) References Cited

U.S. PATENT DOCUMENTS

| | | | |
|---|---|---|---|
| 9,076,983 B2* | 7/2015 | Kim | H10K 59/1315 |
| 9,891,735 B2* | 2/2018 | Bae | G06F 3/0443 |
| 11,036,325 B2* | 6/2021 | Lee | H10K 59/131 |
| 2004/0129685 A1* | 7/2004 | Arai | B23K 26/382 |
| | | | 219/121.77 |
| 2016/0027380 A1* | 1/2016 | Kim | G09G 3/3233 |
| | | | 315/172 |
| 2018/0166518 A1* | 6/2018 | Kim | H10K 59/80524 |
| 2018/0269261 A1* | 9/2018 | Park | H10K 59/873 |
| 2020/0073500 A1* | 3/2020 | Jeong | H10K 71/00 |
| 2020/0185638 A1* | 6/2020 | Choi | H10K 59/124 |
| 2021/0202664 A1* | 7/2021 | Kim | H10K 59/131 |
| 2021/0216188 A1* | 7/2021 | Cheng | G09G 3/3266 |
| 2021/0217835 A1* | 7/2021 | Park | H10K 50/844 |
| 2022/0123055 A1* | 4/2022 | Choung | G06F 3/0443 |
| 2022/0357816 A1* | 11/2022 | Wen | H10K 59/40 |
| 2023/0215349 A1* | 7/2023 | Jung | H10K 50/841 |
| | | | 345/204 |

FOREIGN PATENT DOCUMENTS

| KR | 10-2021-0026454 | 3/2021 |
|---|---|---|
| KR | 10-2021-0090334 | 7/2021 |

* cited by examiner

DISPLAY DEVICE AND A MANUFACTURING METHOD OF THE SAME

CROSS-REFERENCE TO RELATED APPLICATION

This U.S. non-provisional patent application claims priority under 35 U.S.C. § 119 to Korean Patent Application No. 10-2022-0088956, filed on Jul. 19, 2022, the disclosure of which is incorporated by reference herein in its entirety.

TECHNICAL FIELD

The present disclosure relates to a display device and a manufacturing method thereof, and more particularly, to a display device having a reduced dead space and a manufacturing method thereof.

DISCUSSION OF RELATED ART

Electronic devices such as smart phones, digital cameras, notebook computers, navigation systems, and televisions include a display device for displaying an image. The display device may include a display panel configured to generate and display the image and an input device such as a keyboard, a mouse, or an input sensing unit.

The input sensing unit is disposed on the display panel, and when a user touches the input sensing unit such as a touch panel, an input signal is generated. The input signal may also be generated when an electronic pen touches the input sensing unit. The input signal generated at the touch panel may be provided to the display panel, and the display panel may provide the user with an image corresponding to the input signal.

SUMMARY

The present disclosure provides a display device having a reduced dead space by reducing the area required for a connection portion between a common electrode and a voltage line, and a method of manufacturing the same.

An embodiment of the inventive concept provides a display device including: a display panel including a display region and a non-display region adjacent to the display region; and an input sensing unit disposed on the display panel and including an active region overlapping the display region and a peripheral region overlapping the non-display region; wherein the display panel includes: a base layer; a circuit element layer disposed on the base layer and comprising a plurality of insulating layers and a voltage line disposed on any one of the plurality of insulating layers; and a display element layer including a pixel defining film and a light-emitting element, wherein the light-emitting element includes: a first electrode; a second electrode opposite to the first electrode; and at least one organic layer disposed between the first electrode and the second electrode, wherein the at least one organic layer includes: a first portion overlapping the display region; and a second portion at least partially overlapping the non-display region, wherein a first opening is formed in the second portion, and the second electrode and the voltage line are electrically connected to each other through the first opening.

The input sensing unit includes: a plurality of sensing electrodes overlapping the active region; and a plurality of first trace lines connected to some of the plurality of sensing electrodes and partially overlapping the active region, wherein at least some of the plurality of first trace lines overlap the first opening on a plane.

The display region includes a first side extending along a first direction and a second side extending along a second direction crossing the first direction; the plurality of sensing electrodes include a first sensing electrode extending along the first direction and a second sensing electrode extending along the second direction; and the plurality of first trace lines are connected to the first sensing electrode.

The input sensing unit further includes a plurality of second trace lines connected to the second sensing electrode, wherein at least sonic of the plurality of second trace lines overlap the first opening.

The non-display region includes a connection region in which the voltage line is disposed; a through-hole overlapping the first opening is formed in the connection region; and at least some of the plurality of first trace lines overlap the through-hole.

The through-hole includes: a first through-hole adjacent to the first side on a plane; and a second through-hole adjacent to the second side on a plane.

The first through-hole includes a first-1 through-hole and a first-2 through-hole spaced apart from each other along the first direction with the display region interposed therebetween; and each of the plurality of first trace lines and the plurality of second trace lines overlaps at least any one of the first-1 through-hole or the first-2 through-hole.

The second through-hole includes a second-1 through-hole and a second-2 through-hole spaced apart from each other along the second direction with the display region interposed therebetween; and the plurality of second trace lines include a second-1 trace line overlapping the second-1 through-hole and a second-2 trace line overlapping the second-2 through-hole.

The through-hole includes a plurality of unit through-holes spaced apart from each other on a plane.

A second opening corresponding to the first opening is formed in the pixel defining film; and the second electrode is disposed in the second opening.

The plurality of insulating layers include an upper insulating layer disposed on the voltage line; a third opening corresponding to the first opening and the second opening is formed in the upper insulating layer; and the second electrode is disposed in the third opening.

The circuit element layer further includes a data line disposed on any one of the plurality of insulating layers; and the width of the voltage line is greater than the width of the data line.

The display panel further includes an encapsulation layer covering the light-emitting element; and the input sensing unit is disposed directly on the encapsulation layer.

The at least one organic layer includes: a hole control layer disposed on the first electrode; a light-emitting layer disposed on the hole control layer; and an electron control layer disposed on the light-emitting layer, wherein at least a portion of the hole control layer and the electron control layer overlaps the non-display region.

An embodiment of the entive concept provides a display device including: a display panel including a display region and a non-display region adjacent to the display region; and an input sensing unit disposed on the display panel, wherein the display panel includes: a base layer; a circuit element layer disposed on the base layer and including a plurality of insulating layers and a voltage line disposed on any one of the plurality of insulating layers; and a display element layer including a pixel defining film and a light-emitting element, wherein the light-emitting element includes: a first electrode; a second electrode opposite to the first electrode; and at least one organic layer disposed between the first electrode and the second electrode, wherein: the non-display region includes a connection region in which the voltage line is disposed; a first opening overlapping the connection region is formed in the at least one organic layer; and the second electrode and the voltage line are electrically connected through the first opening.

A second opening corresponding to the first opening is formed in the pixel defining film; and the second electrode is disposed in the second opening.

The plurality of insulating layers include an upper insulating layer disposed on the voltage line; a third opening corresponding to the first opening and the second opening is formed in the upper insulating layer; and the second electrode is disposed in the third opening, An embodiment of the inventive concept provides a method for manufacturing a display device, the method including: forming a display panel that includes a display region and a non-display region; and forming an input sensing unit that includes an active region overlapping the display region and a peripheral region overlapping the non-display region on the display panel, wherein the forming of the display panel includes: forming a circuit element layer including a plurality of insulating layers above a base layer and a voltage line disposed on any one of the plurality of insulating layers; and forming a display element layer including a pixel defining film and a light-emitting element on the circuit element layer, wherein: the light-emitting element includes a first electrode, a second electrode opposite to the first electrode, and at least one organic layer disposed between the first electrode and the second electrode; and the forming of the display element layer includes forming a first opening on the organic layer through a laser drilling process to electrically connect the second electrode and the voltage line to each other.

The display region includes a first side extending along a first direction and a second side extending along a second direction crossing the first direction; and the forming cif the first opening includes moving and irradiating a first laser beam in the first direction, and moving and irradiating a second laser beam in the second direction.

The non-display region includes a connection region in which the voltage line is disposed; and in the forming of the first opening, the laser drilling process is performed in the connection region.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

Figure 2A:
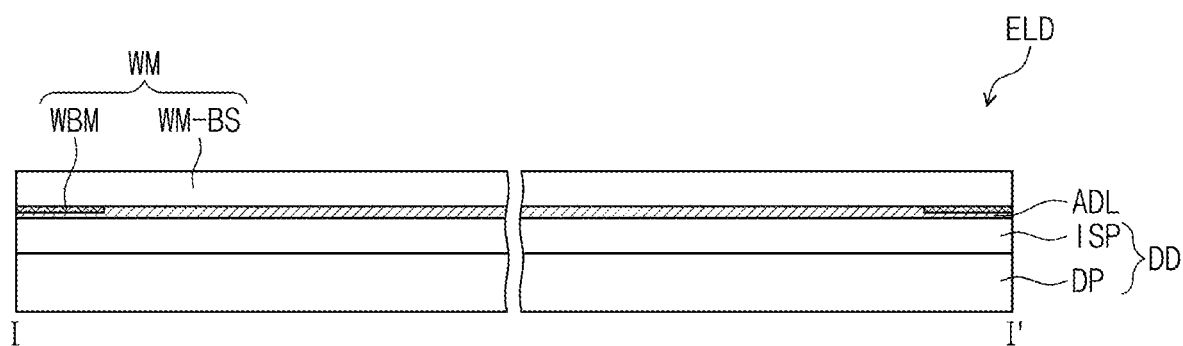
Figure 2B:
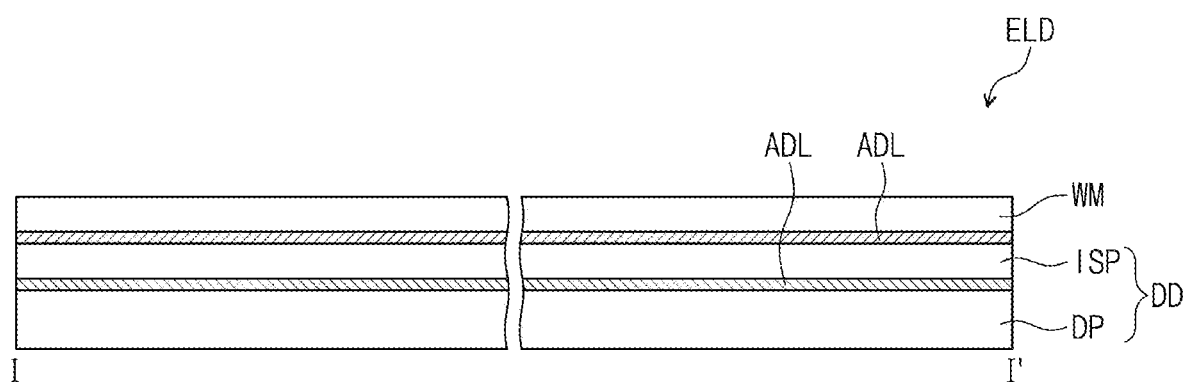
Figure 2C:
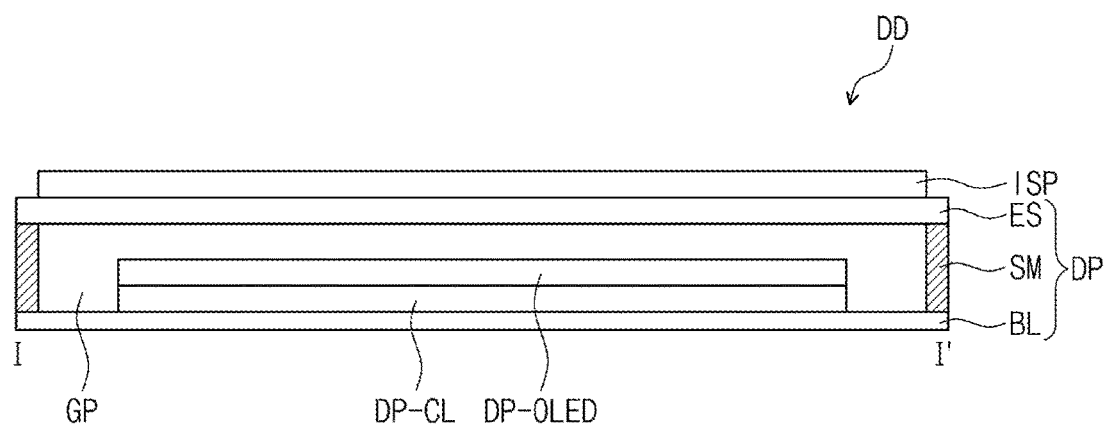
Figure 2D:
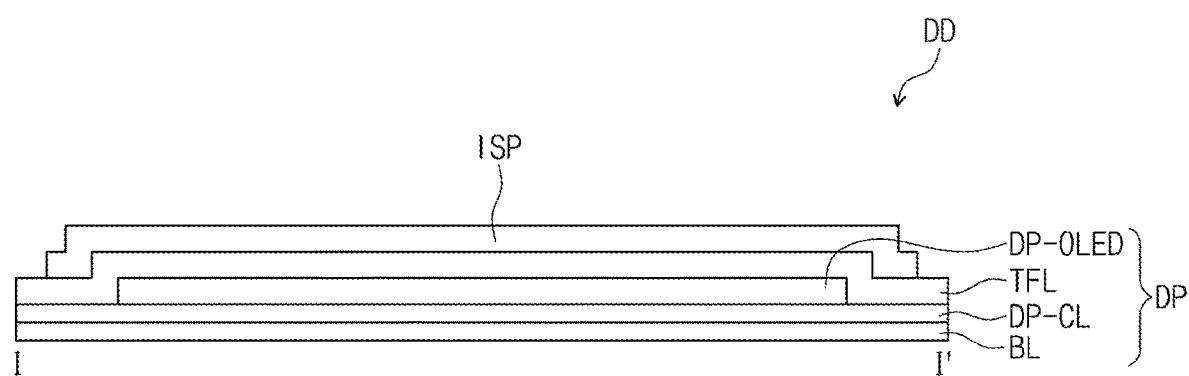
Figure 3:
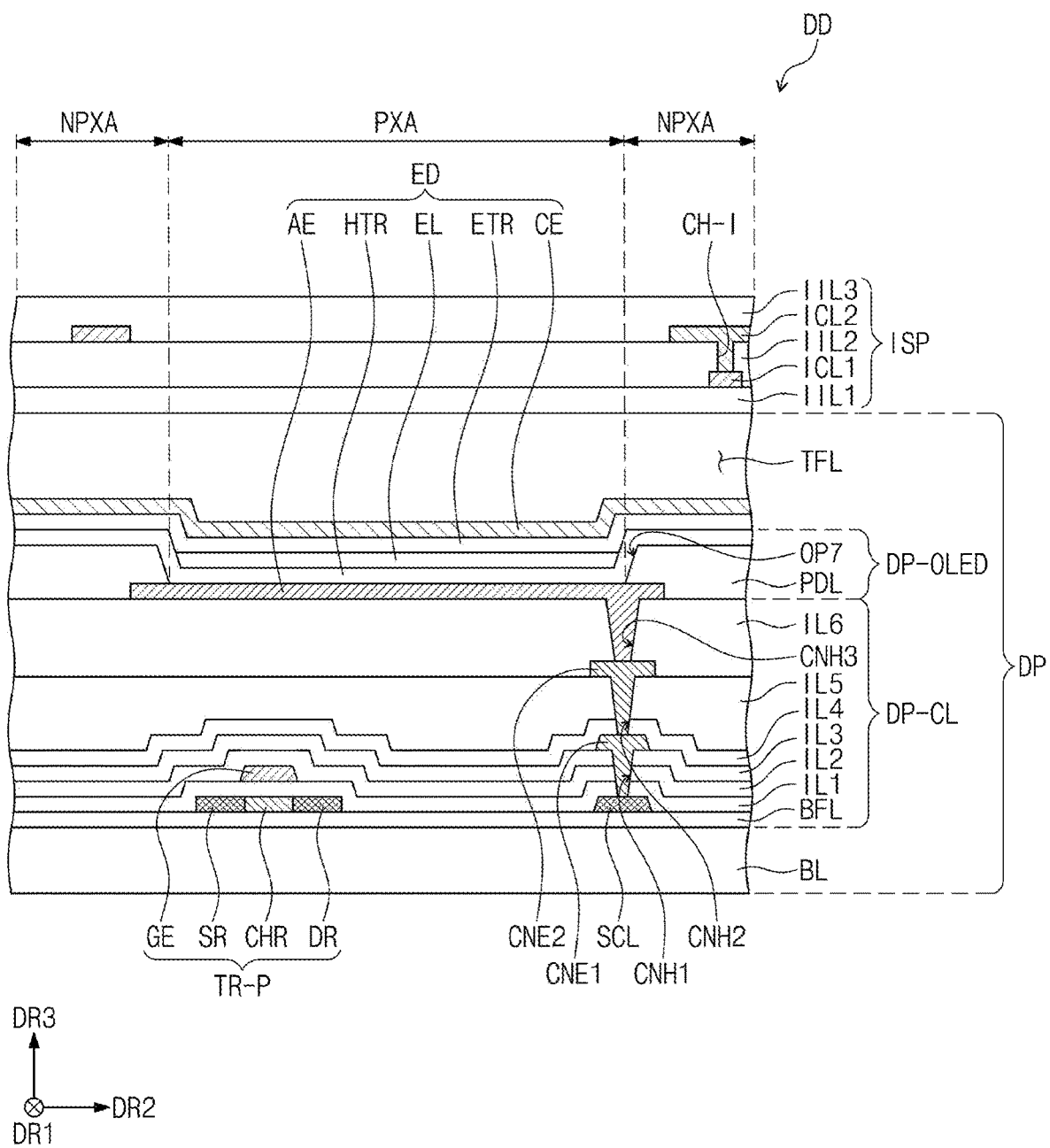
Figure 4A:
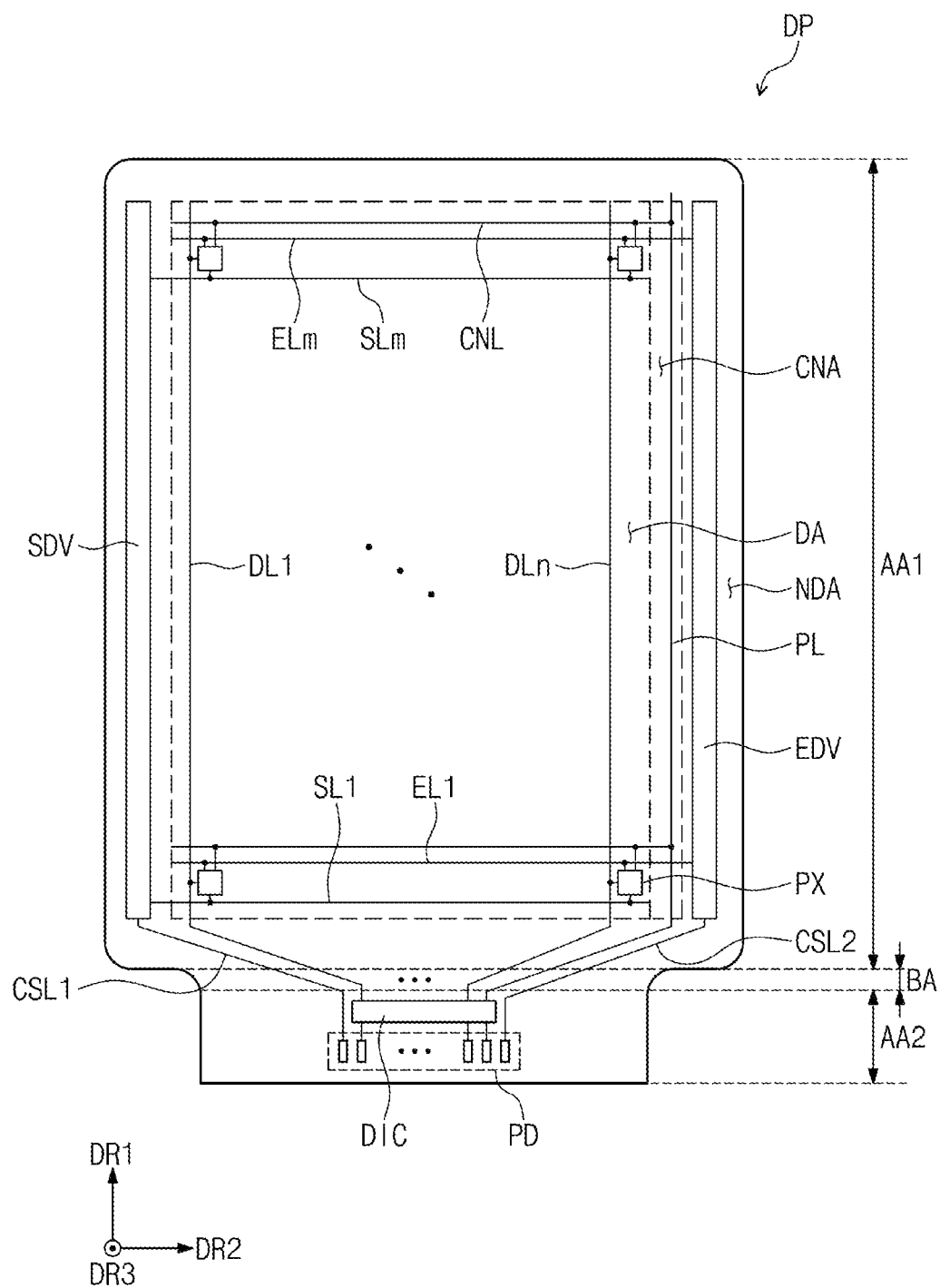
Figure 4B:
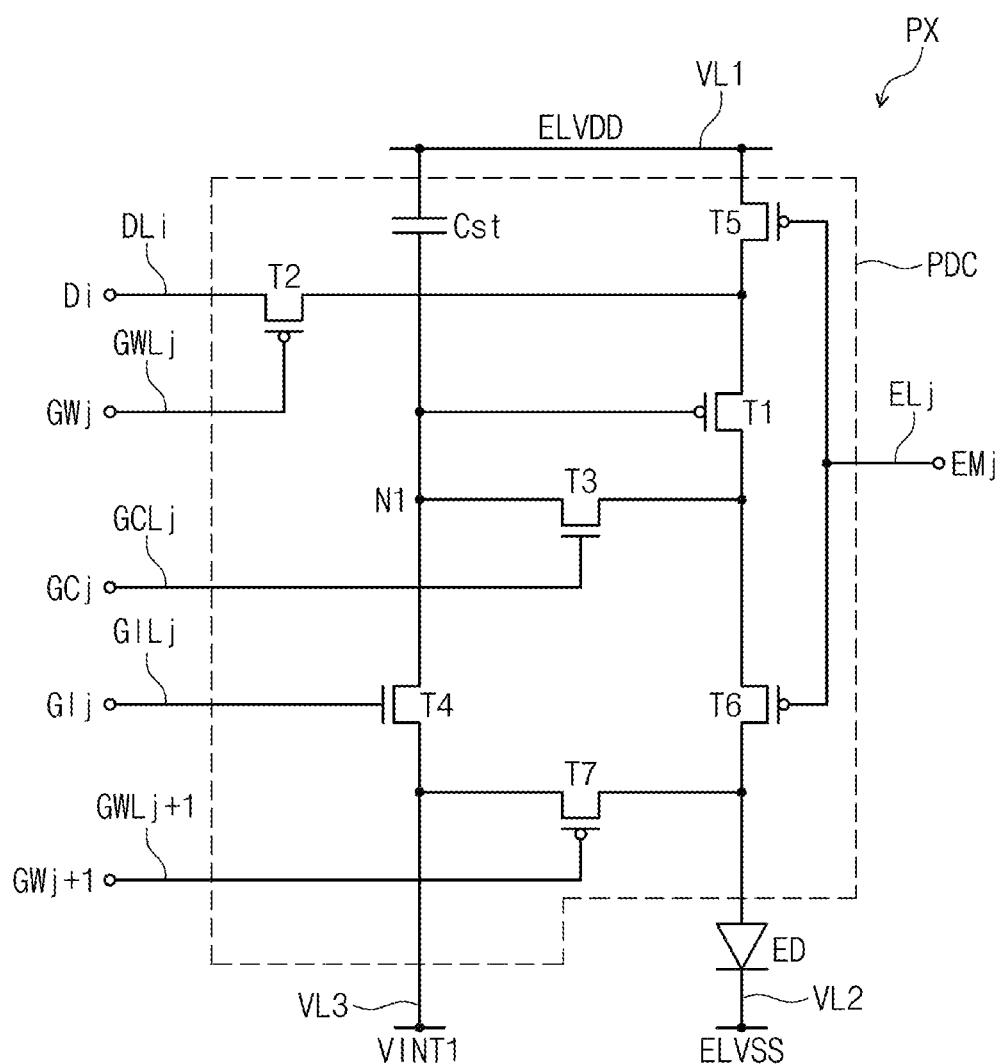
Figure 5:
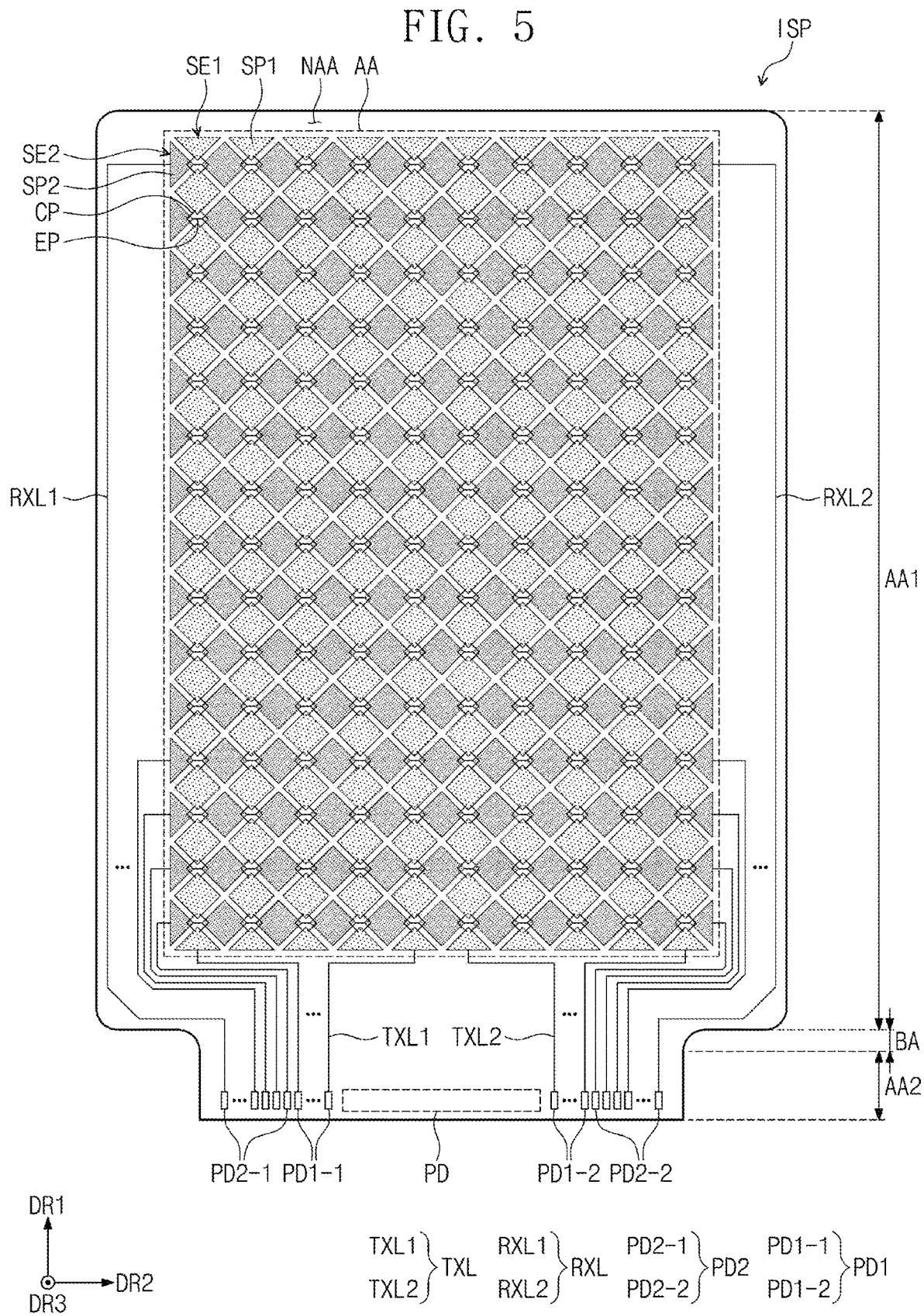
Figure 6:
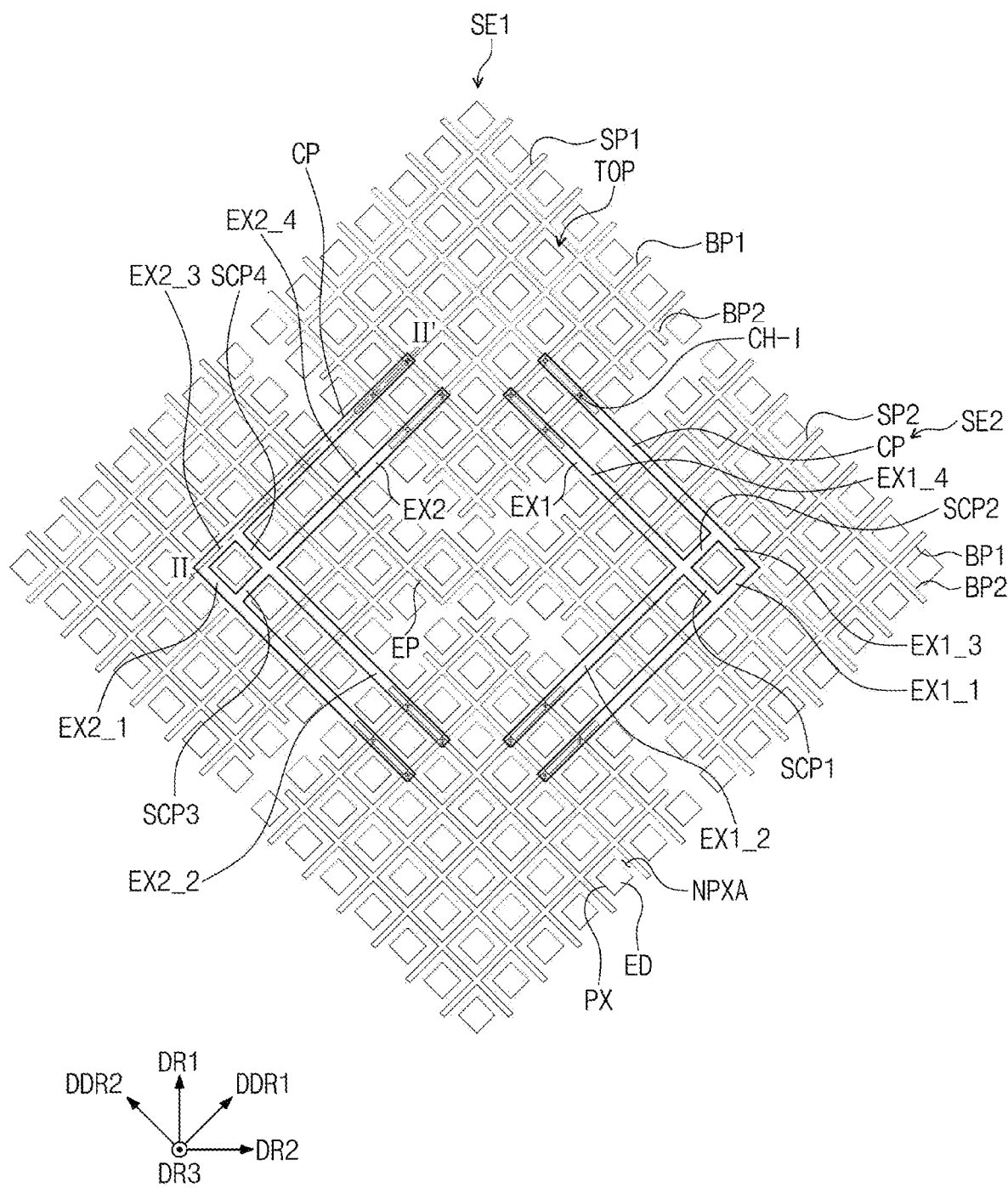
Figure 7:
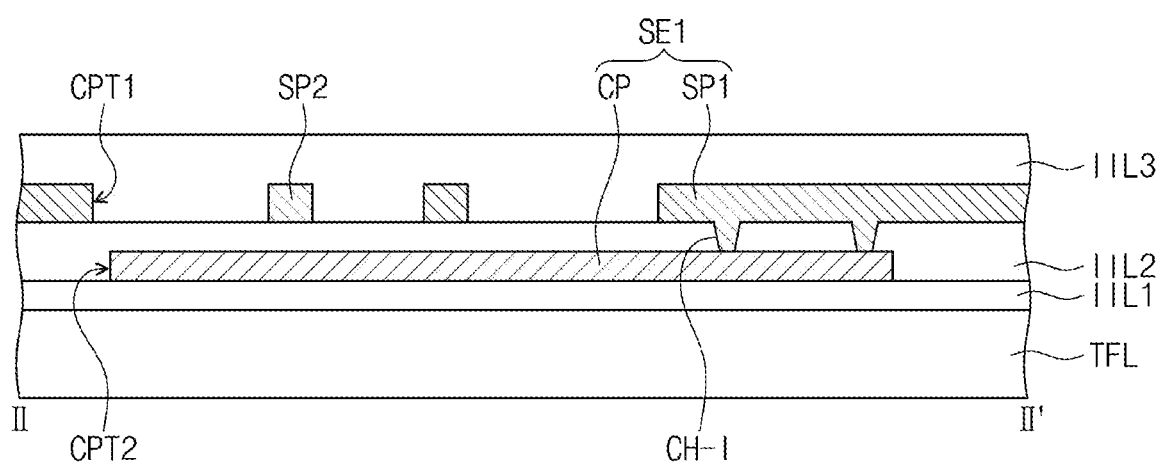
Figure 8:
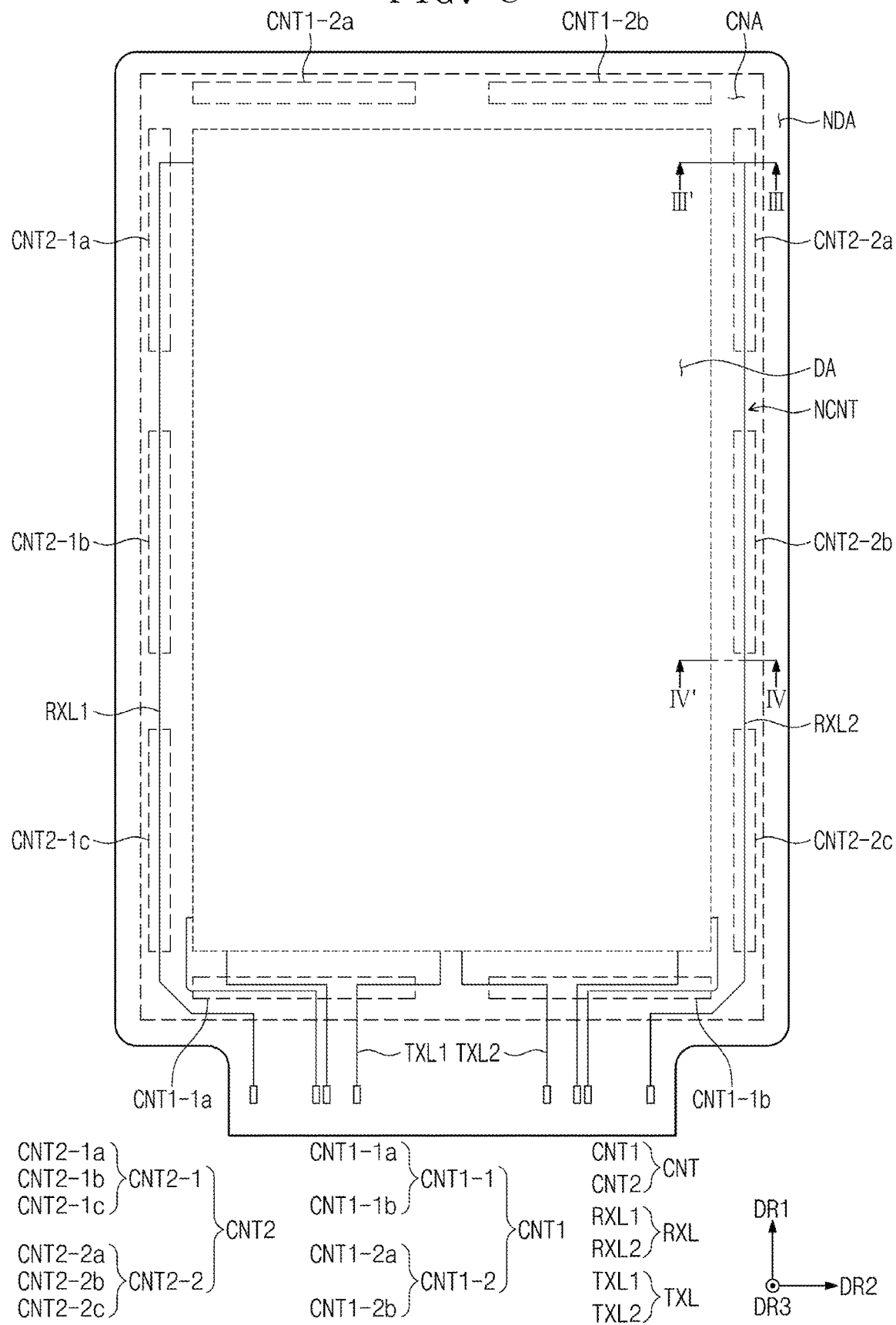
Figure 9A:
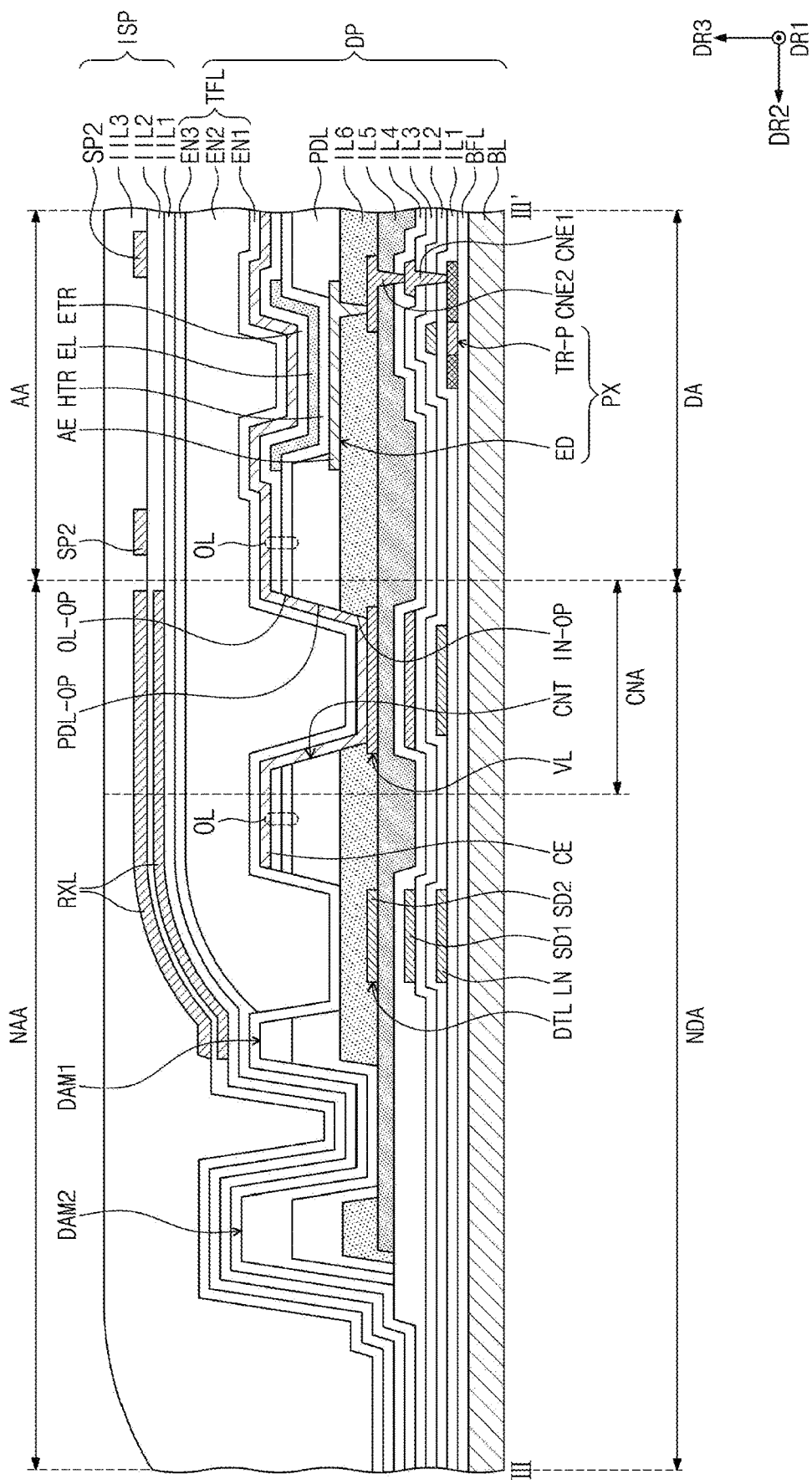
Figure 9B:
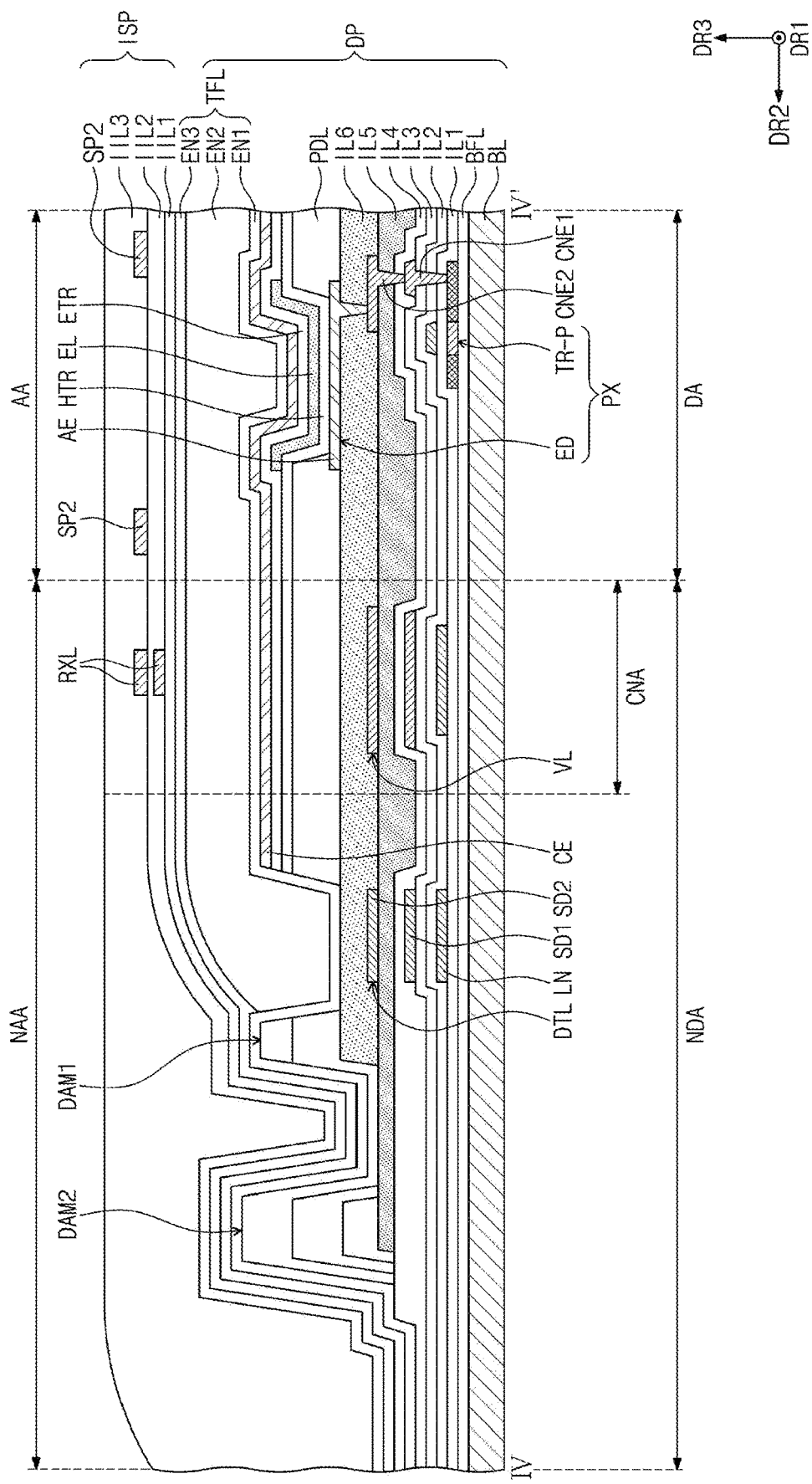
Figure 10:
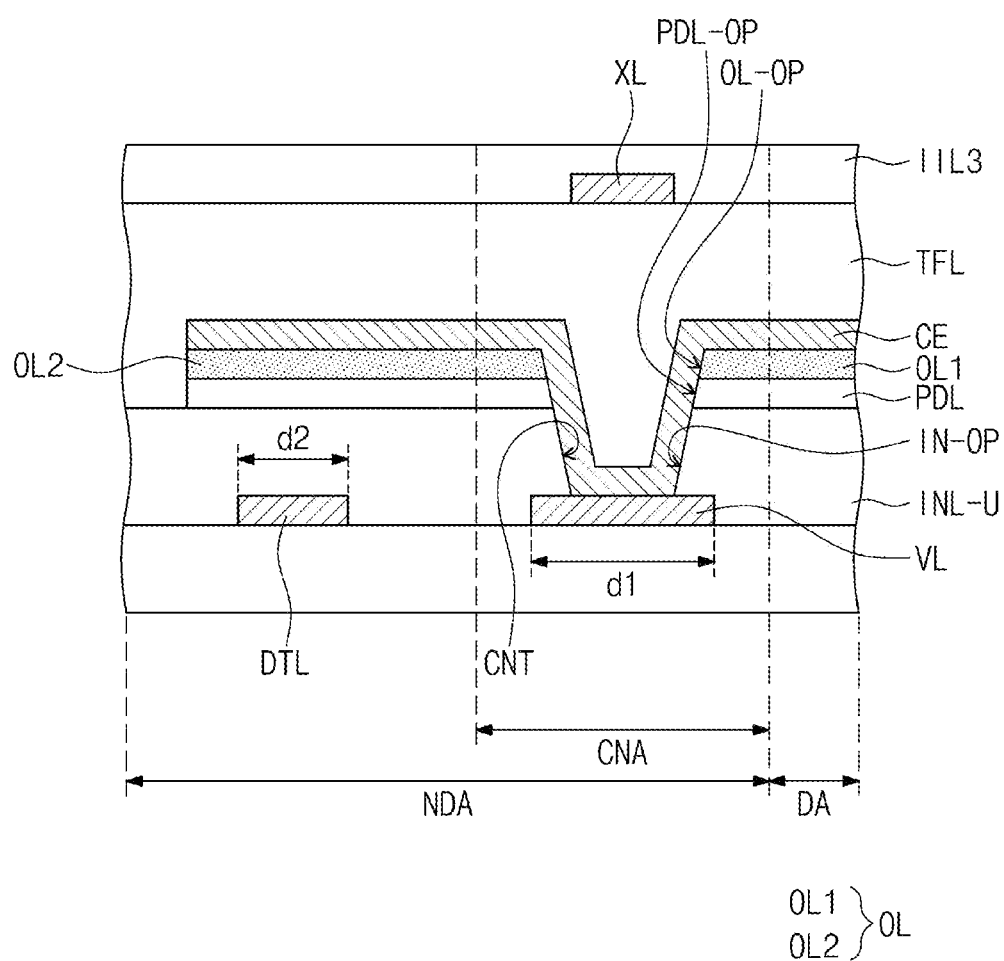
Figure 11A:
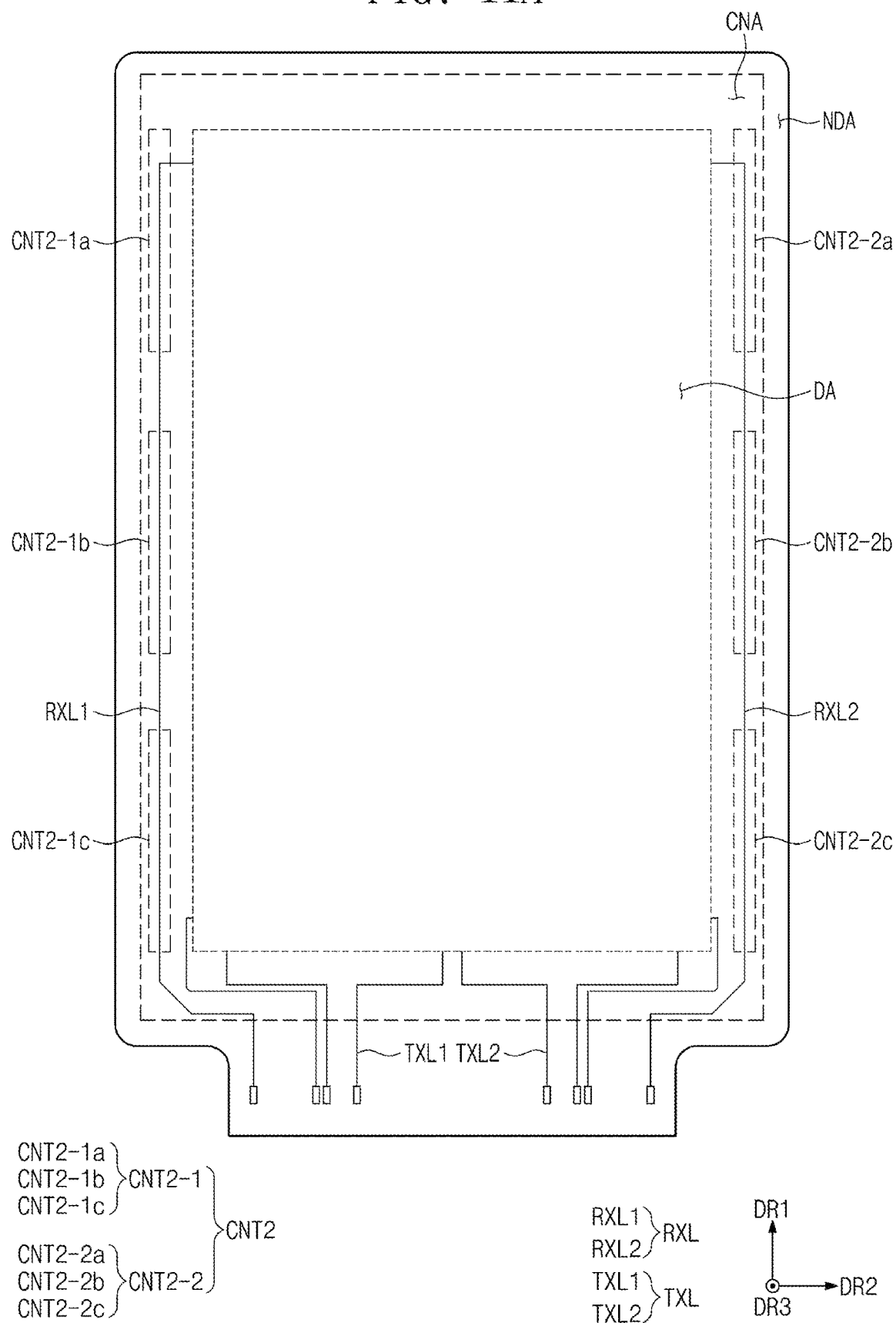
Figure 11B:
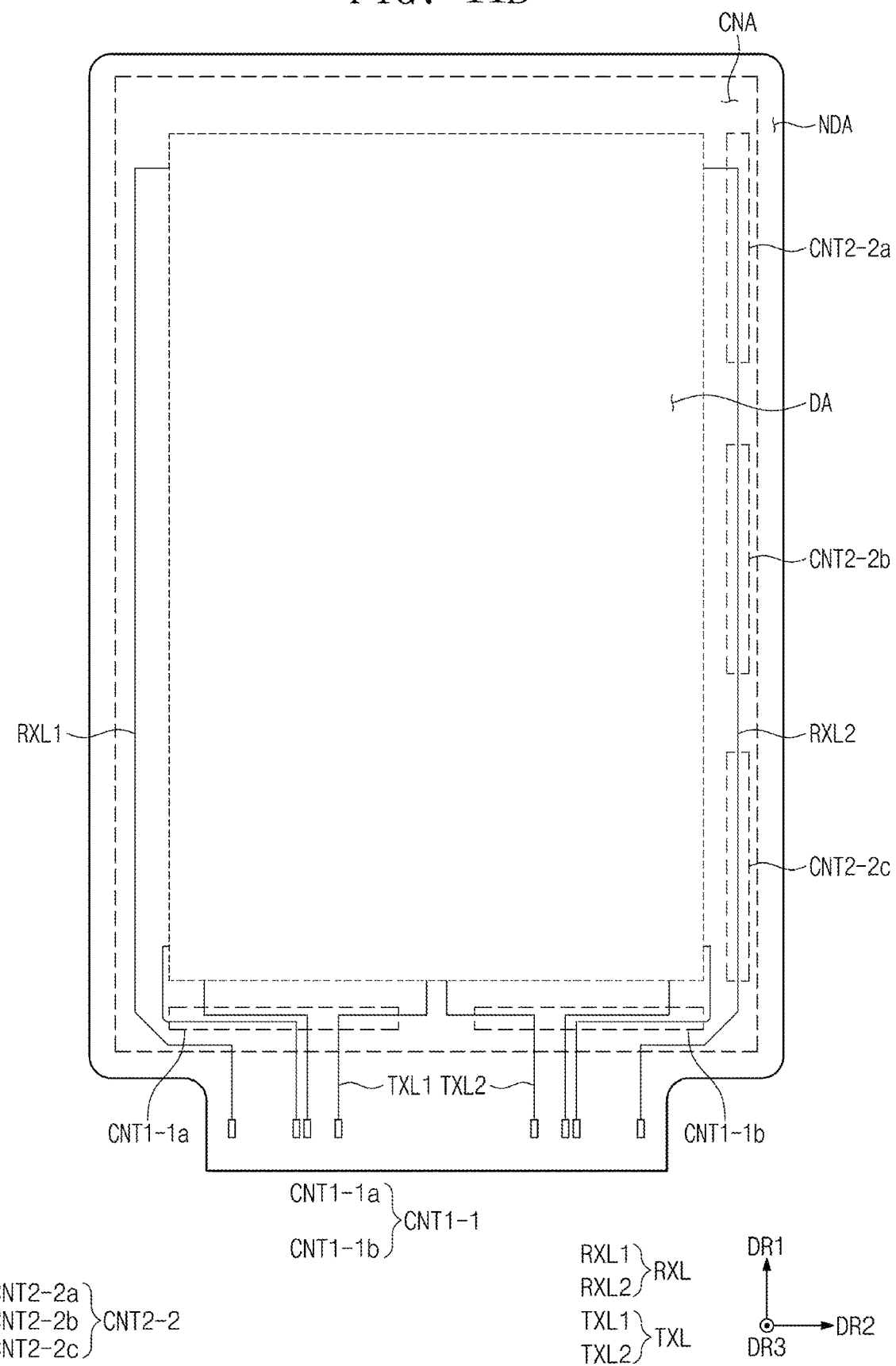
Figure 12A:
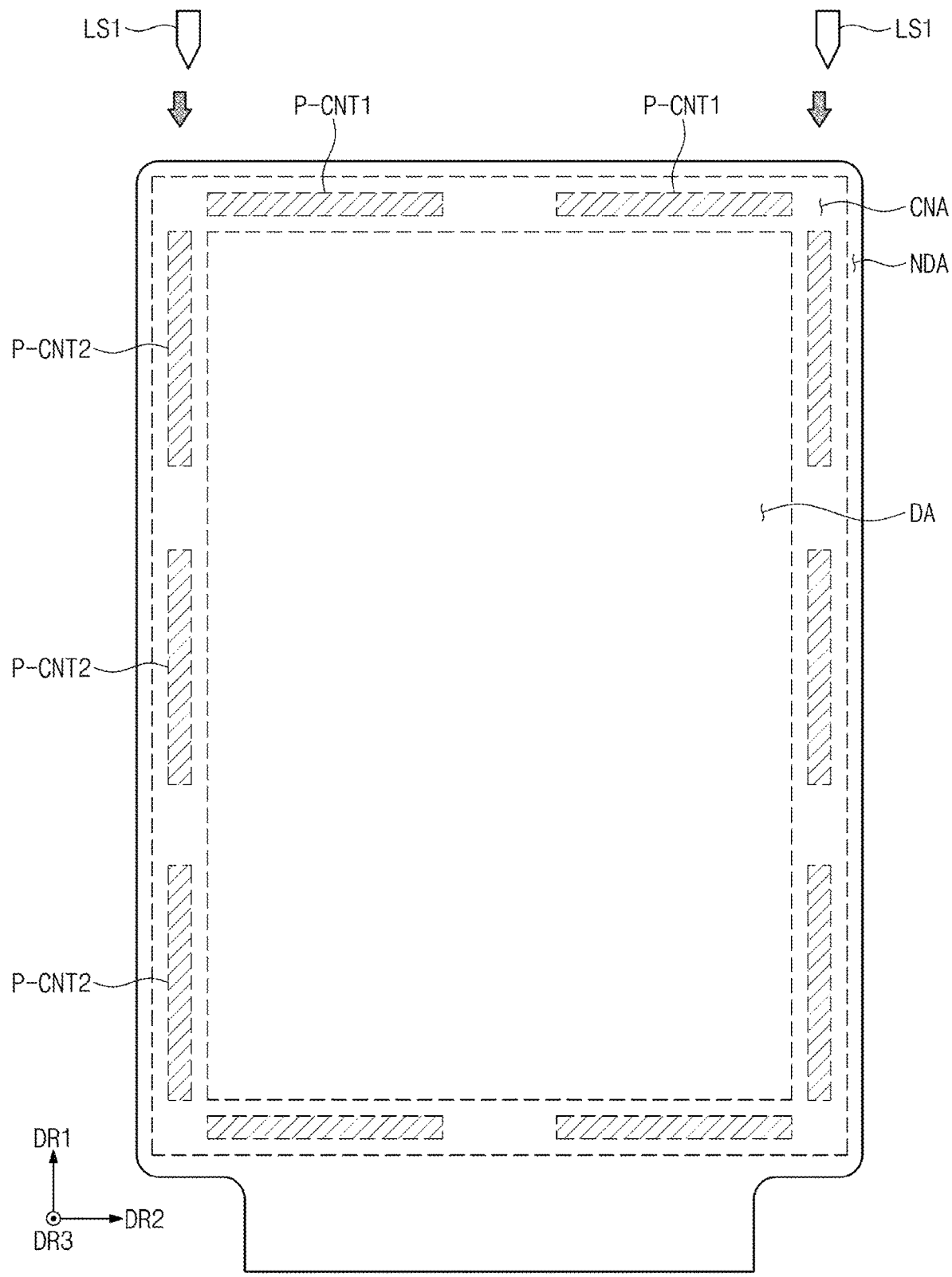
Figure 12B:
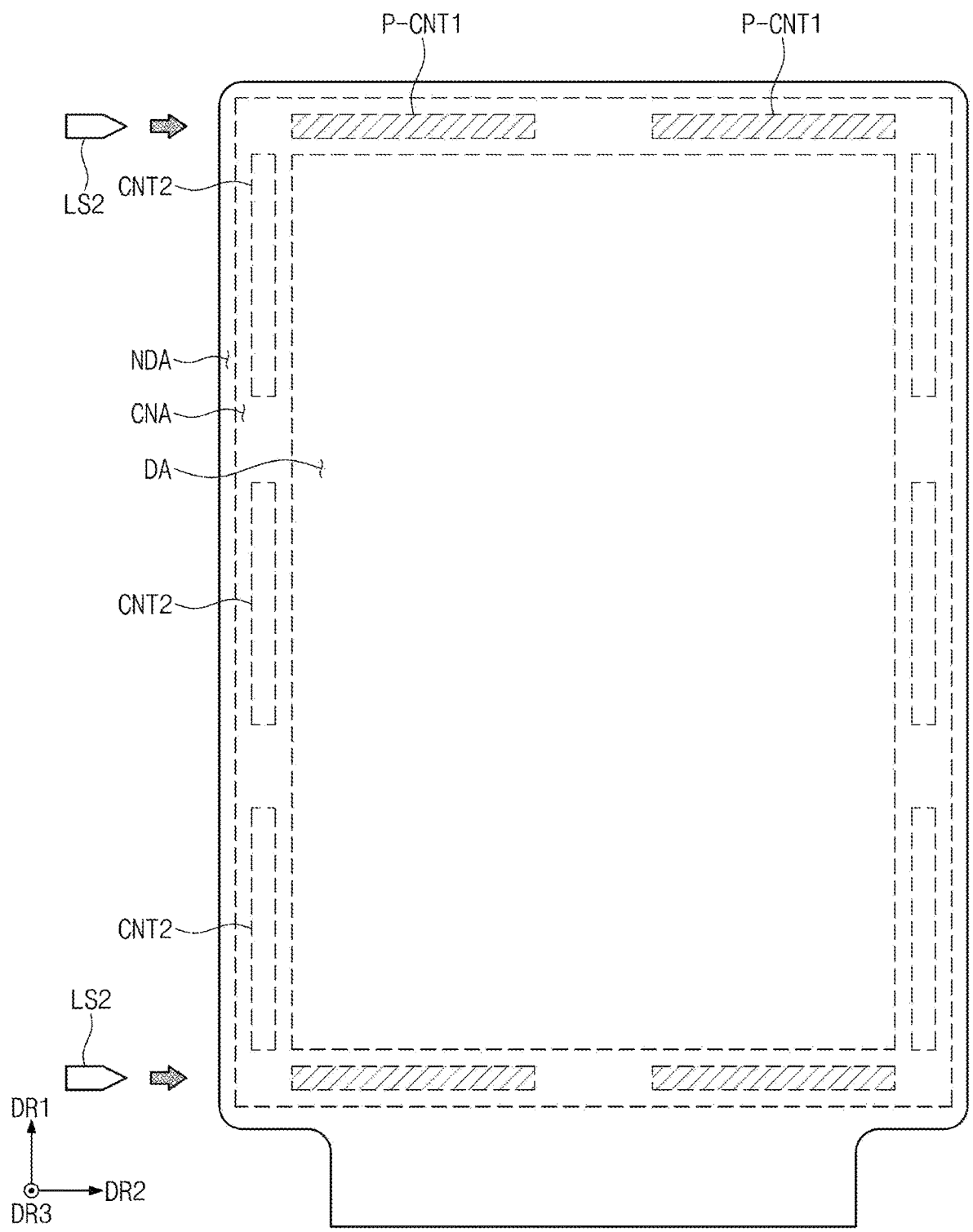

Each of FIGS. 2A and 2B is a cross-sectional view of the electronic device according to an embodiment of the inventive concept;

Each of FIGS. 2C and 2D is a cross-sectional view of a display device according to an embodiment of the inventive concept;

FIG. 3 is an enlarged cross-sectional view of the display device according to an embodiment of the inventive concept;

FIG. 4A is a plan view of a display panel according to an embodiment of the inventive concept;

FIG. 4B is a circuit diagram illustrating a pixel according to an embodiment of the inventive concept;

FIG. 5 is a plan view of an input sensing unit according to an embodiment of the inventive concept;

FIG. 6 is an enlarged plan view of a portion of the input sensing unit according to an embodiment of the inventive concept;

FIG. 7 is an enlarged cross-sectional view of a portion of the input sensing unit according to an embodiment of the inventive concept;

FIG. 8 is a plan view illustrating a configuration of the display device according to an embodiment of the inventive concept;

FIGS. 9A and 9B are cross-sectional views of a portion of the display device according to an embodiment of the inventive concept;

FIG. 10 is a cross-sectional view of a portion of the display device according to an embodiment of the inventive concept;

FIGS. 11A and 11B are plan views illustrating a partial configuration of a display device according to an embodiment of the inventive concept; and FIGS. 12A and 12B are plan views illustrating some steps of a method of manufacturing a display device according to an embodiment of the inventive concept.

DETAILED DESCRIPTION OF THE EMBODIMENTS

Hereinafter, embodiments of the inventive concept will be described with reference to the drawings.

In this specification, it will be understood that when an element (or region, layer, portion, etc.) is referred to as "being on", "connected to" or "coupled to" another element, it can be directly on, connected or coupled to the other element, or intervening elements may be present between them.

The same reference numerals may refer to the same elements. In addition, in the drawings, the thicknesses, ratios, and dimensions of elements may be exaggerated for effective description of technical content. "And/or" includes all combinations of one or more that the associated elements may define.

Terms such as first and second may be used to describe various elements, but the elements should not be limited by the terms. These terms are used for the purpose of distinguishing one element from other elements. For example, a first element may be referred to as a second element, and similarly, a second element may be referred to as a first element. Singular expressions include plural expressions unless the context clearly indicates otherwise. In addition, terms such as "below", "lower", "above", and "upper" are used to describe the relationship between elements shown in the drawings. The terms are relative concepts and are described based on the directions indicated in the drawings.

Terms such as "include" or "have" are intended to designate the presence of a feature, number, step, action, element, portion, or combination thereof described in the specification, and it should be understood that it does not preclude the possibility of presence or addition of one or more other features, numbers, steps, operations, elements, portions, or combinations thereof.

In this specification, the expression "being directly disposed" may mean that there is no layer, film, region, plate, or the like which is added between a part of a layer, film, region, plate, or the like and another part. For example, the expression "being directly disposed" may mean being disposed between two layers or two members without an additional member such as an adhesive member interposed therebetween.

Unless otherwise defined, all terms (including technical and scientific terms) used in this specification have the same meaning as commonly understood by one of ordinary skill in the art to which this invention belongs. In addition, it will be further understood that erms, such as those defined in commonly used dictionaries, should be interpreted as having a meaning that is consistent with their meaning in the context of the related technology, and should not be interpreted in an idealized or overly formal sense unless expressly so defined herein.

Hereinafter, a display device according to an embodiment of the inventive concept will be described with reference to the accompanying drawings.

Figure 1A:
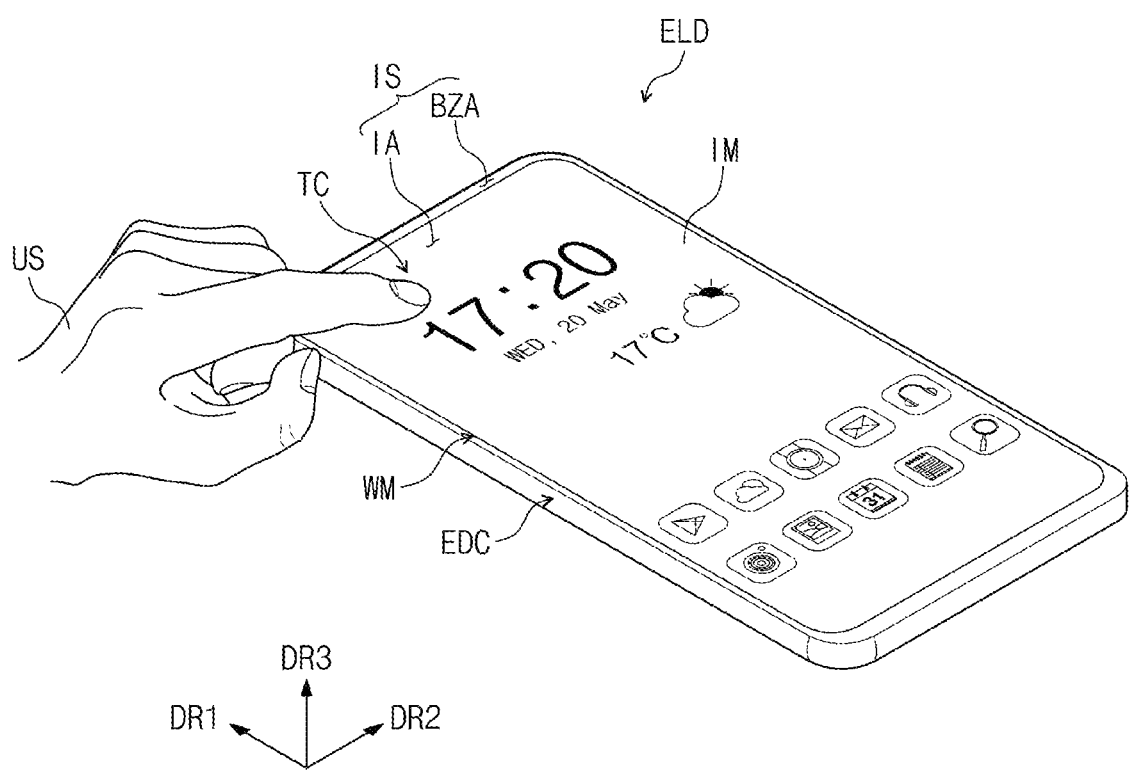
FIG. 1A is a perspective view of an electronic device according to an embodiment of the inventive concept.
Figure 1B:
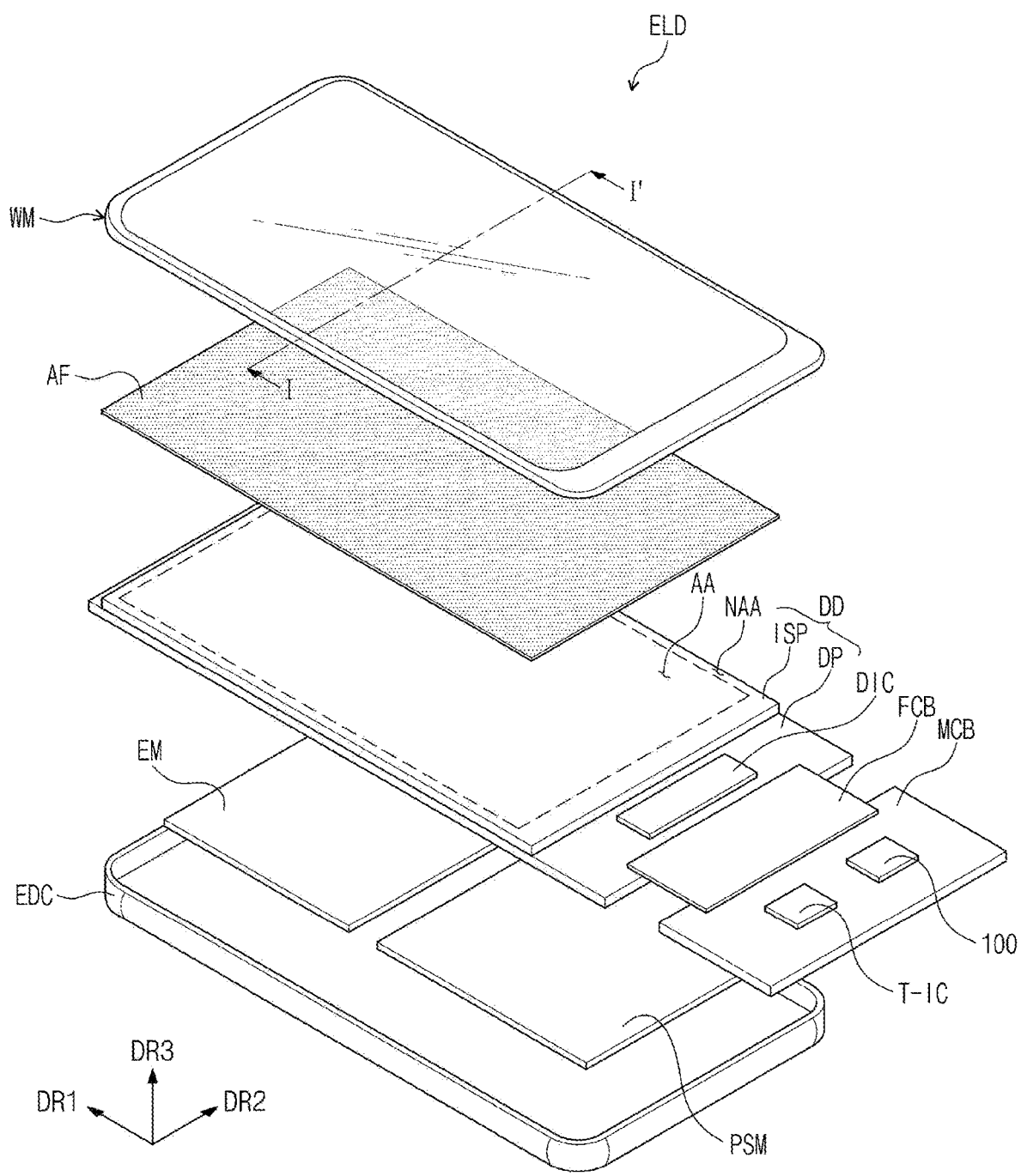
FIG. 1B is an exploded perspective view of the electronic device according to an embodiment of the inventive concept.

FIG. 1A is a perspective view of an electronic device according to an embodiment of the inventive concept. FIG. 1B is an exploded perspective view of the electronic device according to an embodiment of the inventive concept. Each of FIGS. 2A and 2B is a cross-sectional view of the electronic device according to an embodiment of the inventive concept. Each of FIGS. 2A and 2B is a cross-sectional view of the electronic device taken along line I-I' illustrated in FIG. 1B, Each of FIGS. 2C and 2D is a cross-sectional view of a display device according to an embodiment of the inventive concept. Each of FIGS. 2C and 2D is a cross-sectional views of the display device taken along line illustrated in FIG. 1B.

Referring to FIGS. 1A to 1B, the electronic device ELD may be activated according to an electrical signal. The electronic device ELD may be, for example, a smart phone, a tablet computer, a laptop computer, a computer, or a smart television.

The electronic device ELD may display an image IM in a third direction DR3 on a display surface IS parallel to each of a first direction DR1 and a second direction DR2. The display surface IS on which the image IM is displayed may correspond to a front surface of the electronic device ELD. The image IM may include a still image as well as a dynamic image.

In this embodiment, a front surface (or upper surface) and a rear surface (or lower surface) of each member are defined based on a direction in which the image IM is displayed. The front surface and the rear surface may be opposite to each other in the third direction DR3, and a normal direction of each of the front surface and the rear surface may be parallel to the third direction DR3.

The separation distance between the front surface and the rear surface in the third direction DR3 may correspond to the thickness of the electronic device ELD in the third direction DR3. Directions indicated by the first to third directions DR1, DR2, and DR3 may be defined to be different from those defined in FIG. 1A.

The electronic device ELD may sense an external input applied from the outside. The external input may include various inputs provided from the outside of the electronic device ELD. The electronic device ELD according to this embodiment may sense an input TC applied from the outside. As an input by a passive type input means, the input TC may be applied by a body of a user US and include all inputs capable of changing the capacitance of an input sensor. The electronic device ELD may sense the input IC of the user US applied to a side surface or rear surface of the electronic device ELD according to the structure of the electronic device ELD, and the inventive concept is not limited to any one embodiment.

The front surface of the electronic device ELD may include an image region IA and a bezel region BZA. The image region IA may be a region in which an image IM is displayed. A user visually recognizes the image IM through the image region IA. In this embodiment, the image region IA is illustrated in a rectangular shape with rounded vertices. However, this is illustrated as an example, and the image region IA may have various shapes and is not limited to any one embodiment.

The bezel region BZA is adjacent to the image region IA. The bezel region BZA may have a predetermined color. The bezel region BZA may surround the image region IA. Accordingly, the shape of the image region IA may be substantially defined by the bezel region BZA. However, this is illustrated as an example, and the bezel region BLA may be disposed adjacent to only one side of the image region IA or may be omitted. The electronic device ELD according to an embodiment of the inventive concept may include various embodiments and is not limited to any one embodiment.

As illustrated in FIG. 1B, the electronic device ELD may include a display device DD, an optical member AF, a window WM, an electronic module EM, a power module PSM, and a case EDC. The display device DD generates an image and senses an external input. The display device DD may include a display panel DP and an input sensing unit ISP. The display device DD includes an active region AA and a peripheral region NAA corresponding to the image region IA (see FIG. 1A) and the bezel region BZA of the electronic device ELD (see FIG. 1A).

The display panel DP is not particularly limited and may be, for example, a light emitting display panel such as an organic light-emitting display panel or an inorganic light-emitting display panel. A detailed description of the input sensing unit ISP will be described later. The display device DD may further include a main circuit board MCB, a flexible circuit film FCB, a driving circuit DIC, a sensor control circuit T-IC, and a main controller 100. Any one or more of these may be omitted. Each of the driving circuit DIC, the sensor control circuit T-IC, and the main controller 100 may be provided in the form of an integrated chip. The main circuit board MCB may be connected to the flexible circuit film FCB so as to be electrically connected to the display panel DP. The main circuit board MCB may include a plurality of driving elements. The main circuit board MCB may be electrically connected to the electronic module EM through a connector.

The flexible circuit film FCB is connected to the display panel DP to electrically connect the display panel DP and the main circuit board MCB to each other. The display panel DP may be bent so that the flexible circuit film FCB and the main circuit board MCB face the rear surface of the display device DD. In other words, the display panel DP may be bent so that the flexible circuit film FCB and the main circuit board MCB are located at the rear side of the display device DD.

Although FIG. 1B illustrates the driving circuit DIC mounted on the display panel DP as an example, the driving circuit DIC may be mounted on the flexible circuit film FCB.

The driving circuit DIC may include driving elements for driving a pixel of the display panel DP, for example, a data driving circuit.

The input sensing unit ISP may be electrically connected to the main circuit board MCB through an additional flexible circuit film. However, the embodiment of the inventive concept is not limited thereto. The input sensing unit ISP may be electrically connected to the display panel DP and then electrically connected to the ain circuit board MCB through the flexible circuit film FCB.

The optical member AF lowers the reflectance of external light. The optical member AF may include a polarizer and a retarder. The polarizer and the retarder may be of a stretch type or a coating type. The optical axis of a coating type optical film is defined according to the stretching direction of a functional film. The coating type optical film may contain liquid crystal molecules arranged on a base film.

In an embodiment of the inventive concept, the optical member AF may be omitted. In this case, the display device DD may further include a color filter and a black matrix configured to replace the optical member AF. The color filter and the black matrix may be disposed directly on the upper surface of the input sensing unit ISP through a continuous process. The upper surface of the input sensing unit ISP is provided by an uppermost insulating layer of the input sensing unit ISP.

The window WM provides an outer surface of the electronic device ELD. The window WM may include a base substrate and further include functional layers such as an anti-reflection layer and an anti-fingerprint layer.

The display device DD may further include at least one adhesive layer, The adhesive layer may bond adjacent components of the display device DD to each other. The adhesive layer may be an optically transparent adhesive layer or a pressure-sensitive adhesive layer.

The electronic module EM includes at least a main controller. The electronic module EM may include a wireless communication module, an image input module, a sound input module, a sound output module, a memory, an external interface module, and the like. The modules may be mounted on the circuit board or electrically connected to each other through a flexible circuit board. The electronic module EM is electrically connected to the power module PSM.

The main controller controls the overall operation of the electronic device ELD. For example, the main controller activates or deactivates the display device DD according to a user input. The main controller may control the operations of the display device DD, a wireless communication module, an image input module, a sound input module, a sound output module, and the like. The main controller may include at least one microprocessor.

The case EDC may be coupled to the window WM. The case EDC protects the components accommodated in the case EDC by absorbing an external shock and preventing foreign substancesitnoisture from entering into the display device DD. In an embodiment of the inventive concept, the case EDC may be provided in a shape in which a plurality of accommodation members are coupled to each other.

Referring to FIG. 2A, the input sensing unit ISP may be disposed directly on the display panel DP. According to an embodiment of the inventive concept, the input sensing unit ISP may be formed on the display panel DP through a continuous process. In other words, when the input sensing unit ISP is disposed directly on the display panel DP, an adhesive layer is not disposed between the input sensing unit ISP and the display panel DP. However, as illustrated in FIG. 2B, an adhesive layer ADL may be disposed between the input sensing unit ISP and the display panel DP. In this case, the input sensing unit ISP is not manufactured through a continuous process with the display panel DP, but the input sensing unit ISP is manufactured through a process separate from that of the display panel DP and then fixed to the upper surface of the display panel DP by the adhesive layer ADL. In FIGS. 2A and 2B, the optical member AF illustrated in FIG. 1B is not illustrated addition, the configuration disposed on the lower side of the display device DD is not illustrated.

As illustrated in FIG. 2A, the window WM may include a light blocking pattern WBM for defining the bezel region BZA (see FIG. 1A). The light blocking pattern WBM is a colored organic layer and, for example, may be formed on one surface of a base layer WM-BS by a coating method.

As shown in FIG. 2C the display panel DP includes a base layer BL, a circuit element layer DP-GL disposed on the base layer BL, a display element layer DP-OLED, an encapsulation substrate ES, and a sealant SM configured to bond the base layer BL and the encapsulation substrate ES to each other.

The base layer BL may include at least one plastic film. The base layer BL may include a plastic substrate, a glass substrate, a metal substrate, an organic/inorganic composite material substrate, and the like. In this embodiment, the base layer BL may be a thin film glass substrate having a thickness of several tens to everal hundreds of micrometers. The base layer BL may have a multi-layered structure. For example, the base layer BL may include an organic layer (e.g., polyimide layer)/at least one inorganic layer/an organic layer (e.g., polyimide layer).

The circuit element layer DP-CL includes at least one insulating layer and a circuit element, The insulating layer includes at least one inorganic layer and at least one organic layer. The circuit element includes signal lines, a pixel circuit, and the like. A detailed description thereof will be provided later.

The display element layer DP-OLED includes at least a light-emitting element. The display element layer DP-OLED may further include an organic layer such as a pixel defining film. The encapsulation substrate ES may be spaced apart from the display element layer DP-OLEI) with a predetermined gap GP therebetween. The base layer BL and the encapsulation substrate ES may include a plastic substrate, a glass substrate, a metal substrate, an organic/inorganic composite material substrate, or the like. The sealant SM may include an organic adhesive, a frit, or the like. The gap GP may be filled with a predetermined material. The gap GP may be filled with a moisture absorbent or a resin material.

As illustrated in FIG. 2D, the display panel DP includes a base layer BL, a circuit element layer DP-CL disposed on the base layer BL, a display element layer DP-OLED, and an encapsulation layer TFL. The encapsulation layer TFL includes a plurality of thin films. The encapsulation layer TFL may include a thin film encapsulation structure including at least an inorganic layer/an organic layer/an inorganic layer. The encapsulation layer TFL may be disposed to cover a light-emitting element ED (see FIG. 3).

FIG. 3 is an enlarged cross-sectional view of the display device according to an embodiment of the inventive concept. FIG. 3 is illustrated based on the display device of FIG. 2D.

Referring to FIG. 3, the display device DD may include a display panel DP and an input sensing unit ISP disposed directly on the display panel DP. The display panel DP may include a base layer BL, a circuit element layer DP-CL, a display element layer DP-OLED, and an encapsulation layer TFL. The display device DD may include the active region AA and the peripheral region NAA which are described with reference to FIG. 1B, and each of the display panel DP and the input sensing unit ISP may include regions respectively corresponding to the active region AA and the peripheral region NAA of the display device DD. FIG. 3 is an enlarged view of a partial region of the active region AA.

The base layer BL may provide a base surface on which the circuit element layer DP-CL is disposed. The circuit element layer DP-CL may be disposed on the base layer BL. The circuit element layer DP-CL may include an insulating layer, a semiconductor pattern, a conductive pattern, a signal line, and the like. An insulating layer, a semiconductor layer, and a conductive layer may be formed on the base layer BL by a method such as coating, deposition, or the like, and then, the insulating layer, the semiconductor layer, and the conductive layer may be selectively patterned through a plurality of photolithography processes. Hereafter, the semiconductor pattern, the conductive pattern, and the signal line included in the circuit element layer may be formed.

At least one inorganic layer is formed on the upper surface of the base layer In this embodiment, the display panel DP is illustrated as including a buffer layer BFL. The buffer layer BFL may improve a bonding force between the base layer BL and the semiconductor pattern. The buffer layer BFL may include a silicon oxide layer and a silicon nitride layer, wherein the silicon oxide layer and the silicon nitride layer may be alternately stacked on each other.

The semiconductor pattern may be disposed on the buffer layer BFL. The semiconductor pattern may contain polysilicon. However, the embodiment of the inventive concept is not limited thereto, and the semiconductor pattern may contain amorphous silicon or metal oxide.

FIG. 3 illustrates only a portion of the semiconductor pattern, and the semiconductor pattern may be further disposed in another region. The semiconductor pattern may be arranged in a specific rule across pixels. The semiconductor pattern may have different electrical properties depending on whether it is doped or not. The semiconductor pattern may include a first region having high conductivity and a second region having low conductivity. The first region may be doped with an N-type dopant or a P-type dopant. A P-type transistor includes a doped region doped with a P-type dopant. The second region may be a non-doped region or a region doped at a lower concentration than the first region.

The first region has higher conductivity than the second region and serves as an electrode or a signal line. The second region may correspond to an active region (or channel region) of a pixel transistor TR-P. In other words, a portion of the semiconductor pattern may be an active region of the transistor, and the other portion of the semiconductor pattern may be a source region or a drain region of the transistor.

Each of the pixels may have an equivalent circuit including seven transistors, one capacitor, and a light-emitting element, and the equivalent circuit diagram of the pixel may be modified in various forms. FIG. 3 illustrates one pixel transistor TR-P and a light-emitting element ED which are included in a pixel.

A source region SR, a channel region CHR, and a drain region DR of the pixel transistor TR-P may be formed from a semiconductor pattern. The source region SR and the drain region DR may extend in opposite directions from the channel region CHR on a cross section. In other words, the channel region CHR may be disposed between the source region SR and the drain region DR. FIG. 3 illustrates a portion of a signal transmission region SCL formed as the first region of the semiconductor pattern. The signal transmission region SCL may be electrically connected to the pixel transistor TR-P on a plane.

A first insulating layer IL1 may be disposed on the buffer layer BFL, The first insulating layer IL1 may overlap a plurality of pixels in common and cover the semiconductor pattern. The first insulating layer IL1 may be an inorganic layer and/or an organic layer and have a single-layered or multi-layered structure. The first insulating layer IL1 may contain at least one of aluminum oxide, titanium oxide, silicon oxide, silicon nitride, silicon oxynitride, zirconium oxide, or hafnium oxide. In this embodiment, the first insulating layer IL1 may be a single-layered silicon oxide layer. The insulating layers of the circuit element layer DP-CL to be described later as well as the first insulating layer IL1 may be an inorganic layer and/or an organic layer and have a single-layered or multi-layered structure, The inorganic layer may include at least one of the aforementioned materials, but is not limited thereto. A gate GE of the pixel transistor TR-P is disposed on the first insulating layer IL1.

The gate GE may also be referred to as a gate electrode. The gate GE may be a portion of a metal pattern. The gate GE overlaps the channel region CHR. In the process of doping the semiconductor pattern, the gate GE may function as a mask, A second insulating layer IL2 may be disposed on the first insulating ayer IL1 and cover the gate GE. The second insulating layer IL2 may overlap the pixels in common. The second insulating layer IL2 may be an inorganic layer and/or an organic layer and have a single-layered or multi-layered structure. In this embodiment, the second insulating layer IL2 may be a single-layered silicon oxide layer.

A third insulating layer IL3 may be disposed on the second insulating layer IL2, and in this embodiment, the third insulating layer IL3 may he a single-layered silicon oxide layer. A first connection electrode CNE1 may be disposed on the third insulating layer IL3. The first connection electrode CNE1 may be connected to the signal transmission region SCL through a first contact hole CHN1 passing through the first, second, and third insulating layers IL1, IL2, and IL3.

A fourth insulating layer IL4 may be disposed on the third insulating layer IL3. The fourth insulating layer IL4 may be a single-layered silicon oxide layer. A fifth insulating layer IL5 may be disposed on the fourth insulating layer IL4. The fifth insulating layer IL5 may be an organic layer.

A second connection electrode CNE2 may he disposed on the fifth insulating layer IL5. The second connection electrode CNE2 may be connected to the first connection electrode CNE1 through a second contact hole CNH2 passing through the fourth insulating layer IL4 and the fifth insulating layer IL5.

A sixth insulating layer IL6 may be disposed on the fifth insulating layer ILS and cover the second connection electrode CNE2. The sixth insulating layer IL6 may be an organic layer. The display element layer DP-OLED may be disposed on the circuit element layer DP-CL. For example, the display element layer DP-OLED may be disposed on the sixth insulating layer IL6. The display element layer DP-OLED may include a light-emitting element ED. The light-emitting element ED may include a first electrode AE, a light-emitting layer EL, and a second electrode CE. For example, the light-emitting layer EL may contain an organic light-emitting material, a quantum dot, a quantum rod, a micro light emitting diode (LED), or a nano LED.

The first electrode AE may be disposed on the sixth insulating layer IL6. The first electrode AE may be connected to the second connection electrode CNE2 through a third contact hole CNH3 passing through the sixth insulating layer IL6.

A pixel defining film PDL may be disposed on the sixth insulating layer IL6 and cover a portion of the first electrode AL An opening OP7 is formed in the pixel defining film PDL. The opening OP7 of the pixel defining film PDL exposes at least a portion of the first electrode AE. In this embodiment, a light-emitting region PXA corresponds to a partial region of the first electrode AE exposed by the opening OP7. A non-light-emitting region NPXA may surround the light-emitting region PXA.

The light-emitting layer EL may be disposed above the first electrode AL. The light-emitting layer EL may be disposed to correspond to the opening OP7. In other words, the light-emitting layer EL may be separately formed in each of the pixels. When the light-emitting layer EL is separately formed in each of the pixels, each of the light-emitting layers EL may emit light of at least one color of blue, red, or green. However, the embodiment of the inventive concept is not limited thereto, and the light-emitting layer EL may be connected to the pixels so as to be provided in common. In this case, the light-emitting layer EL may provide blue light or white light.

The second electrode CE may be disposed above the light-emitting layer EL. The second electrode CE may have an integral shape and may be commonly disposed in the plurality of pixels. A common voltage may be provided to the second electrode CE, and the second electrode CE may be referred to as a common electrode.

In the light-emitting element ED, a hole control layer HTR may be disposed between the first electrode AE and the light-emitting layer EL. The hole control layer HTR may be commonly disposed in the light-emitting region PXA and the non-light-emitting region NPXA. The hole control layer HTR may include a hole transport layer and further include a hole injection layer. An electron control layer ETR may be disposed between the light-emitting layer and the second electrode CE. The electron control layer ETR may include an electron transport layer and further include an electron injection layer, The hole control layer HTR and the electron control layer ETR may be commonly formed in the pixels by using an open mask.

The light-emitting element ED may further include a capping layer disposed on the second electrode CE. The capping layer may protect the light-emitting element ED from an external foreign substance. The capping layer having a predetermined refractive index may improve the optical efficiency of the light-emitting element ED.

The encapsulation layer TFL may be disposed on the second electrode CE and cover the light-emitting element ED, The encapsulation layer TFL may include a plurality of thin films, The encapsulation layer TFL may include a thin film encapsulation structure including at least an inorganic layer/an organic layer/an inorganic layer.

The input sensing unit ISP may be formed directly on the upper surface of the encapsulation layer TFL through a continuous process. The input sensing unit ISP may include a first sensing insulating layer IIL1, a first sensing conductive layer ICL1, a second sensing insulating layer IIL2, a second sensing conductive layer ICL2, and a third sensing insulating layer IIL3. In an embodiment of the inventive concept, the first sensing insulating layer IIL1. may he omitted.

Each of the first sensing conductive layer ICU and the second sensing conductive layer ICL2 may include a plurality of patterns having a single-layered structure or a multi-layered structure stacked along the third direction DR3. A single-layered conductive layer may include a metal layer or a transparent conductive layer. The metal layer may contain molybdenum, silver, titanium, copper, aluminum, or an alloy thereof. The transparent conductive layer may contain transparent conductive oxide such as indium tin oxide (ITO), indium zinc oxide (IZO), zinc oxide (ZnO), and indium zinc tin oxide (IZTO). In addition, the transparent conductive layer may contain a conductive polymer such as PEDOT, metal nanowires, graphene, and the like. A multi-layered conductive layer may include metal layers. The metal layers may have, for example, a three-layer structure of titanium/aluminum/titanium. The multi-layered conductive layer may include at least one metal layer and at least one transparent conductive layer.

The second sensing insulating layer IIL2 covers the first sensing conductive layer ICL1, and the third sensing insulating layer IIL3 covers the second sensing conductive layer ICL2, Although the first sensing insulating layer IIL1 to the third sensing insulating layer IIL3 are each illustrated as a single layer, the embodiment of the inventive concept is not limited thereto.

At least any one of the first sensing insulating layer IIL1 or the second sensing insulating layer IIL2 may include an inorganic film. The inorganic film may contain at least one of aluminum oxide, titanium oxide, silicon oxide, silicon nitride, silicon oxynitride, zirconium oxide, or hafnium oxide.

The third sensing insulating layer IIL3 may include an organic film. The organic film may contain at least any one of an acrylic-based resin, a methamilic-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

FIG. 4A is a plan view of a display panel according to an embodiment of the inventive concept. FIG. 4B is a circuit diagram illustrating a pixel according to an embodiment of the inventive concept.

Referring to FIG. 4A, the display panel DP may be divided into a display region DA and a non-display region NDA on a plane. The display region DA of the display panel DP may be a region in which an image is displayed, and the non-display region NDA may be a region in which a driving circuit or a driving line is disposed. The light-emitting elements of each of a plurality of pixels PX may be disposed in the display region DA. The display region DA may overlap at least a portion of the image region IA (see FIG. 1A) of the electronic device ELD (see FIG. 1A), and the non-display region NDA may be covered by the bezel region BZA (see FIG. 1A) of the electronic device ELD (see FIG. 1A). The display region DA and the non-display region NDA of the display panel DP may respectively correspond to the active region AA and the peripheral region NAA of the display device DD illustrated in FIG. 1B, According to an embodiment of the inventive concept, the display panel DP may include a plurality of pixels PX (hereinafter referred to as pixels), a plurality of signal lines, a scan driver SDV, a light-emitting driver EDV, and a driving circuit DIC, and a display pad.

The planar region of the display panel DP may include a first region AA1, a second region AA2, and a bending region BA between the first region AA1 and the second region AA2. The first region AA1 may extend longer in the first direction DR1 than in the second direction DR2. In the second direction DR2, the lengths of the second region AA2 and the bending region BA may be smaller than the length of the first region AA1, The first region AA1 may include the display region DA and a portion of the non-display region NDA which are described above. The bending region BA and the second region AA2 may be a non-display region NDA.

The display panel DP may include a plurality of pixels PX, a plurality of scan lines SL1 to SLm, a plurality of data lines DL1 to DLn, a plurality of light-emitting lines EL1 to ELm, first and second control lines CSL1 and CSL2, a power line PL, a plurality of connection lines CNL, and a plurality of pads PD. Here, m and n may be integers of 1 or more.

The pixels PX may be disposed in the display region DA. The scan driver SDV and the light emission driver EMT may be respectively disposed in the non-display region NDA adjacent to both sides of the display panel DP, which extend in the first direction DWI and are opposite to each other in the second direction DR2. The driving circuit DIC may be disposed in the second region AA2. The driving circuit DIC may include a data driving unit.

The scan lines SL1 to SLm may extend in the second direction DR2 to be connected to the pixels PX and the scan driver SDV. Data lines DL1 to DLn may extend in the first direction DR1 so as to be connected to the pixels PX. The data lines DL1 to DLn may extend to the second region AA2 via the bending region BA to be connected to the driving circuit DIC. The light-emitting lines EL1 to ELm may extend in the second direction DR2 to be connected to the pixels PX and the light emission driver EDV.

Each of the scan driver SDV and the light emission driver EDV may include a plurality of thin film transistors formed through the same process as the driving circuit of the pixels PX, for example, a low temperature polycrystalline silicon (UPS) process or a low temperature polycrystalline oxide (LTPO) process.

A power line PL may extend in the first direction DR1 and be disposed between the display region DA and the light emission driver EDV, The power line PL may extend toward the second region AA2 via the bending region BA. A portion of the non-display region NDA in which the power line PL is disposed may be referred to as a connection region CNA. A detailed description of the connection region CNA will be described later. Although FIG. 4A illustrates that the power line PL is disposed at one side of the display region DA, the embodiment of the inventive concept is not limited thereto, and the power line PL may extend to surround the upper, lower, left, and right sides of the display region DA. Accordingly, the connection region CNA may surround the display region DA. The power line PL, may be any one of voltage lines VL1, VL2, and VL3 (see FIG. 4B), which will be described later.

The connection lines CNL may extend in the second direction DR2 and be arranged in the first direction DR1 to be connected to the power line PL and the pixels PX. A driving voltage for driving the pixels PX may be applied to the pixels PX through the power line PL and the connection lines CNL which are connected to each other.

The first control line CSLI may be connected to the scan driver SDV and extend toward the second region AA2 via the bending region BA. The second control line CSL2 may be connected to the light emission driver EDV and extend toward the second region AA2 via the bending region BA. The driving circuit DIC may be disposed between the first control line CSLI and the second control line CSL2.

The pads PD may be disposed in the second region AA2 and adjacent to one side of the second region AA2 extending in the second direction DR2. The pads PD may be closer to the one side of the second region AA2 than the driving circuit DIC. For example, the pads PD may be adjacent to a lowermost edge of the display panel DP shown in FIG. 4A.

A data driver, the power line PL, the first control line CSL1, and the second control line CSL2 may be connected to the pads PD, The data lines DL1 to DLn may be connected to the driving circuit DIC, and the data driver may be connected to the pads PD corresponding to the data lines DL1 to DLn.

The bending region BA may be bent so that the second region AA2 is disposed under the first region AA1. In this case, when viewed on a plane, the second region AA2 and the driving circuit DIC may not be visually recognized from the outside.

The display panel DP may further include a timing controller configured to control the operation of the scan driver SDV, the light emission driver EDV, and the driving circuit DIC, and a voltage generator configured to generate a driving voltage. The timing controller and the voltage generator may be connected to the pads PD through a printed circuit board.

The scan driver SDV may generate a plurality of scan signals, and the scan signals may be applied to the pixels PX through the scan lines SL1 to SLm. The data driver may generate a plurality of data voltages, and the data voltages may be applied to the pixels PX through the data lines DL1 to DLn. The light emission driver EDV may generate a plurality of light-emitting signals, and the light-emitting signals may be applied to the pixels PX through the light-emitting lines EL1 to ELm.

The pixels PX may receive the data voltages in response to the: scan signals. The pixels PX may display an image by emitting light having a luminance corresponding to the data voltages in response to the light-emitting signals. Each of the pixels PX may include a light-emitting element and a plurality of transistors connected thereto.

FIG. 4B is a circuit diagram illustrating a pixel according to an embodiment of the inventive concept.

FIG. 4B illustrates an equivalent circuit diagram of one of the plurality of pixels PX illustrated in FIG. 4A. Each of the plurality of pixels PX may have a same circuit structure.

Referring to FIG. 4B, the pixel PX is connected to an i-th data line DLi among data lines, a j-th initialization scan line GILj among initialization scan lines, a j-th compensation scan line GCLj among compensation scan lines, a j-th write scan line GWLj and a j+1-th write scan line GWLj+1 among write scan lines, and a j-th light-emitting control line ELj among light-emitting control lines.

The pixel PX includes a light-emitting element ED and a pixel driving circuit PDC. The light-emitting element ED may be a light-emitting diode. As an example of the inventive concept, the light-emitting element ED may be an organic light-emitting diode including an organic light-emitting layer.

The pixel driving circuit PDC may include first to seventh transistors T1, T2, T3, T4, T5, T6, and T7, and one storage capacitor Cst. The first to seventh transistors T1, T2, T3, T4, T5, T6, and T7 may be respectively referred to as a driving thin film transistor T1, a switching thin film transistor T2, a compensation thin film transistor T3, a first initialization thin film transistor T4, an operation control thin film transistor T5, a light-emitting control thin film transistor T6, and a second initialization thin film transistor T7.

Some of the first to seventh transistors T1, T2, T3,14, T5, T6, and T7 may be P-type transistors, and the others of the first to seventh transistors T1, T2, T3, T4, 15, T6, and T7 may be N-type transistors. For example, the first, second, fifth, sixth, and seventh transistors T1, T2, T5, T6, and 17 may be PNIOS transistors, and the third and fourth transistors T3 and T4 may be NMOS transistors.

At least one of the first to seventh transistors T1, T2, T3, T4, T5, T6, or T7 may be a transistor having a low-temperature polycrystalline silicon (LTPS) semiconductor layer, and at least one of the first to seventh transistors T1, T2, T3, T4, T5, T6, or T7 may be a transistor having an oxide semiconductor layer.

Specifically, the driving thin film transistor T1, which directly affects the brightness of a display device, is configured to include a semiconductor layer composed of polycrystalline silicon having high reliability. Therefore, a high-resolution display device may be achieved.

Since an oxide semiconductor has a high carrier mobility and a low leakage current, a voltage drop is not great even when a driving time is long. In other words, since a color change of an image due to the voltage drop is not great even during low-frequency driving, the low-frequency driving is possible. As described above, since the oxide semiconductor has an advantage that leakage current is small, it is possible to not only prevent leakage current, which may flow to a driving gate electrode, but also to reduce power consumption by adopting, as an oxide semiconductor, at least one of the third transistor T3 or the fourth transistor T4 connected to the driving gate electrode of the first transistor T1.

The first, second, fifth, sixth, and seventh transistors T1, T2, T5, T6, and T7 may have a low-temperature polysili con semiconductor layer, and the third and fourth transistors T3 and T4 may have an oxide semiconductor layer.

The configuration of the pixel driving circuit PDC according to the inventive concept is not limited to the embodiment illustrated in FIG. 4B. The pixel driving circuit PDC illustrated in FIG. 4B is only an example, and the configuration of the pixel driving circuit PDC may be modified. For example, all of the first to seventh transistors T1, T2, T3, T4, T5, T6, and T7 may be P-type transistors or N-type transistors, The j-th initialization scan line GILj, the j-th compensation scan line GCLj, the j-th write scan line GWLj, the j+1-th write scan line GWL and the j-th light-emitting control line ELj may respectively transmit, to the pixel PX, a j-th initialization scan signal GIj, a j-th compensation scan signal GCj, a j-th write scan signal GWj, a j+1-th write scan signal GWj+1, and a j-th light-emitting control signal EMj. The i-th data line DLi transfers an i-th data signal Di to the pixel PX. The i-th data signal Di may have a voltage level corresponding to that of an image signal input into the display device DD.

A first driving voltage line VL1 and a second driving voltage line VL2 may respectively transmit a first driving voltage ELVDD and a second driving voltage ELVSS to the pixel PX. In addition, a first initialization voltage line VL3 may transmit a first initialization voltage VINT1 to the pixel PX.

The first transistor T1 is connected between the first driving voltage line 1,7L1 configured to receive the first driving voltage ELVDD and the light-emitting element ED. The first transistor T1 includes a first electrode connected to the first driving voltage line VL1 via the fifth transistor T5, a second electrode electrically connected to the anode of the light-emitting element ED via the sixth transistor T6, and a third electrode connected to one end of the storage capacitor Cst. The third electrode of the first transistor T1 may be a gate electrode. The first transistor T1 may receive the i-th data signal Di transmitted from the i-th data line DLi according to the switching operation of the second transistor T2 to supply a driving current to the light-emitting element ED.

The second transistor T2 is connected between the i-th data line DLi and the first electrode of the first transistor T1. The second transistor T2 includes a first electrode connected to the i-th data line DLi, a second electrode connected to the first electrode of the first transistor T1, and a third electrode connected to the j-th write scan line GWLj. The third electrode of the second transistor T2 may be a gate electrode. The second transistor T2 may be turned on according to the write scan signal GWj received through the j-th write scan line GWij and then transmit the i-th data signal Di, which is transmitted from the i-th data line DLi, to the first electrode of the transistor T1.

The third transistor T3 is connected between the second electrode of the first transistor T1 and a first node N1. The third transistor 13 includes a first electrode connected to the third electrode of the first transistor T1, a second electrode connected to the second electrode of the first transistor T1, and a third electrode connected to the j-th compensation scan line GCLj. The third electrode of the third transistor T3 may be a gate electrode. The third transistor T3 may be turned on according to the j-th compensation scan signal GCj received through the j-th compensation scan line GCLj and connect the third electrode and the second electrode of the first transistor T1 to each other, thus diode-connecting the first transistor T1.

The fourth transistor T4 is connected between the first initialization voltage line VL3, to which the first initialization voltage VINT1 is applied, and the first node N1. The fourth transistor T4 includes a first electrode connected to the third electrode of the first transistor T1, a second electrode connected to the first initialization voltage line VL3 to which the first initialization voltage VINT1 is transmitted, and a third electrode connected to the j-th initialization scan line GILj. The third electrode of the fourth transistor T4 may be a gate electrode. The fourth transistor T4 is turned on according to the j-th initialization scan signal GIj received through the j-th initialization scan line GILj. The turned-on fourth transistor T4 provides the first initialization voltage VINT1 to the third electrode of the first transistor T1 to initialize the electric potential (e.g., the electric potential of the first node N1) of the third electrode of the first transistor T1.

The fifth transistor T5 includes a first electrode connected to the first driving voltage line VLI, a second electrode connected to the first electrode of the first transistor T1, and a third electrode connected to the i-th light-emitting control line ELj.

The sixth transistor T6 includes a first electrode connected to the second electrode of the first transistor T1, a second electrode connected to the anode of the light-emitting element ED, and a third electrode connected to the j-th light-emitting control line ELS. The third electrode of the each of the fifth and sixth transistors T5 and To may be a gate electrode.

The fifth and sixth transistors T5 and T6 are simultaneously turned on according to the j-th light-emitting control signal EMj received through the j-th light-emitting control line ELj. The first driving voltage ELVDD applied through the turned-on fifth transistor T5 may be compensated through the diode-connected first transistor T1 and then provided to the light-emitting element ED.

The seventh transistor T7 includes a first electrode connected to the first initialization voltage line VL3 to which the first initialization voltage VNT1 is applied, a second electrode connected to the second electrode of the sixth transistor T6, and a third electrode connected to the j+1-th write scan line GWLj+1. The third electrode of the seventh transistor T7 may be a gate electrode. As an example of the inventive concept, the first initialization voltage VINT1 may be a negative constant voltage. For example, the first initialization voltage VINT1 may be a voltage of −3.5V, but is not particularly limited thereto.

As described above, one end of the storage capacitor Cst is connected to the third electrode of the first transistor T1, and the other end of the storage capacitor Cst is connected to the first driving voltage line VL1. The cathode of the light-emitting element ED may be connected to the second driving voltage line VL2 configured to transmit the second driving voltage ELVSS. The second driving voltage ELVSS may have a lower voltage level than the first driving voltage ELVDD. As an example of the inventive concept, the second driving voltage ELVSS may have a lower voltage level than the first initialization voltage VINT1.

FIG. 5 is a plan view of an input sensing unit according to an embodiment of the inventive concept.

Referring to FIG. 5, the input sensing unit ISP may include a plurality of sensing electrodes SE1 and SE2, a plurality of trace lines TXL, and RXL, and a plurality of first and second pads PD1 and PD2. The sensing electrodes SE1 and SE2, the trace lines TXL and RXL, and the first and second pads PD1 and PD2 may be disposed on the encapsulation layer TFL of the display panel DP.

When viewed on a plane, the planar region of the input sensing unit ISP may include a first region AA1, a second region AA2, and a bending region BA. The first region AA1, the second region AA2, and the bending region BA of the input sensing unit ISP may respectively correspond to the first region AA1, the second region AA2, and the bending region BA of the display panel DP illustrated in FIG. 4A, The first region AA1 may include an active region AA and a peripheral region NAA around the active region AA. The active region AA may overlap the display region DA, and the peripheral region NAA may overlap the non-display region NDA. The second region AA2 and the bending region BA may be referred to as the peripheral region NAA.

The sensing electrodes SE1 and SE2 may be disposed in the active region AA, and the first and second pads PD1 and PD2 may be disposed in the peripheral region NAA. The first and second pads PD1 and PD2 may be disposed in the second region AA2. When viewed on a plane, the first pads PD1 and the second pads PD2 may be adjacent to one side of the second region AA2 extending in the second direction DR2.

The first pads PD1 may include a plurality of first-1 pads PD1-1 and a plurality of first-2 pads PD1-2. The second pads PD2 may include a plurality of second-1 pads PD2-1 and a plurality of second-2 pads PD2-2.

When viewed on a plane, the pads PD may be disposed between the first-1 pads PD1-1 and the first-2 pads PD1-2. The first-1 pads PD1-1 may be disposed between the pads PD and the second-1 pads PD2-1. The first-2 pads PD1-2 may be disposed between the pads PD and the second-2 pads PD2-2.

When viewed on a plane, the first-1 pads PD1-1 and the second-1 pads PD2-1 may be disposed on the left side of the pads PD, When viewed on a plane,the first-2 pads PD1-2 and the second-2 pads PD2-2 may be disposed on the right side of the pads PD.

The trace lines TX, and RXL may be connected to the sensing electrodes SE1 and SE2 and extend to the peripheral region NAA to be connected to the first and second pads PD1 and PD2. A sensing controller configured to control the input sensing unit ISP may be connected to the first and second pads PD1 and PD2 through a printed circuit board.

The sensing electrodes SE1 and SE2 may include a plurality of first sensing electrodes SE1 extending in the first direction DM and arranged in the second direction DR2 and a plurality of second sensing electrodes SE2 extending in the second direction DR2 and arranged in the first direction DR1. The second sensing electrodes SE2 may be insulated from and extend to cross the first sensing electrodes SE1.

The trace lines TXL and RXL may include a plurality of first trace lines TXL connected to the first sensing electrodes SE1 and a plurality of second trace lines RXL connected to the second sensing electrodes SE2. The first trace lines TXL may be connected to one ends of the first sensing electrodes SE1. The one ends of the first sensing electrodes SE1 to which the first trace lines TXL are connected may be adjacent to the second region AA2. The second trace lines RXL may be connected to both ends of the second sensing electrodes SE2. The both ends of the second sensing electrodes SE2 may be opposite to each other in the second direction DR2. In the input sensing unit ISP of an embodiment illustrated in FIG. 5, the first trace lines TXL are illustrated as being connected to only one end of the first sensing electrode SE1, but the embodiment of the inventive concept is not limited thereto, and the first trace lines TXL may also be connected to both ends of the first sensing electrode SE1 like the second trace lines RXL. In other words, the first trace lines TXL, may be connected not only to the lower side of the first sensing electrode SE1 (as shown in FIG. 5), but also to the upper side of the first sensing electrode SE1.

The first trace lines TXL may extend to the peripheral region NAA to be connected to the first pads PDT. The first trace lines TXL may extend to the second region AA2 via the bending region BA.

The second trace lines RXL may extend to the peripheral region NAA to be connected to the second pads PD2. The second trace lines RXL may respectively extend in the first direction DM to extend to the peripheral region NAA adjacent to both sides of the first region AA1 opposite to each other in the second direction DR2. The second trace lines RXL may extend to the second region AA2 via the bending region BA.

The first trace lines TXL may include a plurality of first-1 trace lines TXL1 and a plurality of first-2 trace lines TXL2. The first-1 trace lines TXL1 may be connected to some of the first sensing electrodes SE1 and the first-1 pads PD1-1. For example, the first-1 trace lines TXL1 may be connected to one ends of the first sensing electrodes SE1 disposed on the left side of the center of the active region AA.

The first-2 trace lines TXL2 may be connected to other first sensing electrodes SE1 and the first-2 pads PD1-2. For example, the first-2 trace lines TXL2 may be connected to one ends of the first sensing electrodes SE1 disposed on the tight side of the center of the active region AA.

The second trace lines RXT , may include a plurality of second-1 trace lines RXL1 and a plurality of second-2 trace lines RXL2. The second-1 trace lines RXL1 may be connected to one ends of the second sensing electrodes SE2 and the second-1 pads PD2-1. For example, the second-1 trace lines RXL1 may be disposed in the peripheral region NAA on the left side of the first region AA1, and the one ends of the second sensing electrodes SE2 to which the second-1 trace lines RXL1 are connected may be adjacent to the peripheral region NAA on the left side thereof The second-2 trace lines RXL2 may be connected to other ends of the second sensing electrodes SE2 and the second-2 pads PD2-2. For example, the second-2 trace lines RXL2 may be disposed in the peripheral region NAA on the right side of the first region AA1, and the other ends of the second sensing electrodes SE2 to which the second-2 trace lines RXL2 are connected may be adjacent to the peripheral region NAA on the right side thereof.

Driving signals for driving the first and second sensing electrodes SE1 and. SE2 may be applied to the first and second sensing electrodes SE1 and SE2 through the first trace lines TXL. Sensing signals sensed by the first and second sensing electrodes SE1 and SE2 may be output, through the second trace lines RXL.

Each of the first sensing electrodes SE1 may include a plurality of first sensing portions SP1 arranged in the first direction DR1 and a plurality of connection patterns CP connecting the first sensing portions SP1 to each other. Each of the connection patterns CP may extend toward two first sensing portions SP1 adjacent to each other in the first direction DR1 via two second sensing portions SP2 adjacent to each other in the second direction DR2.

Each of the connection patterns CP may be disposed between two first sensing portions SP1 adjacent to each other in the first direction DR1 to connect the two first sensing portions SP1. In other words, two connection patterns CP may be used to connect two adjacent first sensing portions SP1 to each other. For example, an insulating layer may be disposed between the connection patterns CP and the first sensing portions SP1, and the connection patterns CP may be connected to the first sensing portions SP1 through contactholes in the insulating layer, Each of the second sensing electrodes SE2 may include a plurality of second sensing portions SP2 arranged in the second direction DR2 and a plurality of extension patterns EP extendi.ng from the second sensing portions SP2, in each of the second sensing electrodes SE2, the extension patterns EP may be integrally formed with the second sensing portions SP2. Each of the extension patterns EP may be disposed between two second sensing portions SP2 adjacent to each other in the second direction DR2 and extend from the two second sensing portions SP2.

The first sensing portions SP1 and the second sensing portions SP2 may not overlap each other and may be alternately disposed to be spaced apart from each other. capacitance may be formed by the first sensing portions SP1 and the second sensing portions SP2, When viewed on a plane, the extension patterns EP may be disposed between the connection patterns CP and may not overlap the connection patterns CR The first and second sensing portions SP1 and SP2 and the extension patterns EP may be disposed on the same layer. The connection patterns CP may be disposed on a layer different from those of the first and second sensing portions SP1 and SP2 and the extension patterns EP. In an embodiment of the inventive concept, the first and second sensing portions SP1 and SP2 and the extension patterns EP may correspond to the aforementioned second sensing conductive layer ICL2 (see FIG. 3), and the connection patterns CP may correspond to the aforementioned first sensing conductive layer ICU (see FIG. 3), FIG. 6 is an enlarged plan view of a portion of the input sensing unit according to an embodiment of the inventive concept. FIG. 7 is an enlarged cross-sectional view of a portion of the input sensing unit according, to an embodiment of the inventive concept. FIG. 6 is an enlarged view of two first sensing portions adjacent to each other and two second sensing portions adjacent to each other, which are illustrated in FIG. 5. FIG. 7 illustrates a cross section corresponding to the line II-II'of FIG. 6.

Referring to FIG. 6, the first sensing portions SP1 and the second sensing portions SP2 may have a mesh shape. In order to have the mesh shape, each of the first and second sensing portions SP1 and SP2 may include a plurality of first branch portions BP1 extending in a first diagonal direction DDR1 and a plurality of second branch portions BP2 extending in a second diagonal direction DDR2.

The first diagonal direction DDR1 may be a direction crossing the first and second directions DR1 and DR2 on a plane formed by the first and second directions DIU and DR2. The second diagonal direction DDR2 may be a direction crossing the first diagonal direction DDR1 on a plane formed by the first and second directions DR1 and DR2. For example, the first direction DR1 and the second direction DR2 may cross each other perpendicularly, and the first diagonal direction DDR1 and the second diagonal direction DDR2 may cross each other perpendicularly.

The first branch portions BP1 of each of the first and second sensing portions SP1 and SP2 may cross the second branch portions BP2 of each of the first and second sensing portions SP1 and SP2 and be integrally formed with each other. Touch openings TOP having a rhombus shape may be formed by the first branch portions BP1 and the second branch portions BP2.

When viewed on a plane, the light-emitting regions PXA may be disposed in the touch openings TOP. A light-emitting element ED may be disposed in each of the light-emitting regions PXA. Each of the light-emitting regions PXA may be the pixel region PXA illustrated in FIG. 3. The first and second sensing portions SP1 and SP2 may be disposed in the non-light-emitting region NPXA. Since the first and second sensing portions SP1 and SP2 are disposed in the non-light-emitting region NPXA, light generated in the light-emitting regions PXA may be emitted normally without being affected by the first and second sensing portions SP1 and SP2.

The connection pattern CP may extend so as not to overlap the extension pattern EP to connect the first sensing portions SP1 to each other. The connection pattern CP may be connected to the first sensing portions SP1 through a plurality of contact holes CH-I. Hereinafter, the structure of the contact holes CH-I will be illustrated in FIG. 7. The connection pattern CP may extend toward the first sensing portions SP1 via regions overlapping the second sensing portions SP2.

The extension pattern EP may be disposed between the first sensing portions SP1 and extend from the second sensing portions SP2. The second sensing portions SP2 and the extension pattern EP may be integrally formed. The extension pattern EP may have a mesh shape. The extension pattern EP, the first sensing portions SP1, and the second sensing portions SP2 may be disposed on the same layer and formed by being simultaneously patterned with a same material.

The connection pattern CP may include a first extension portion EX1 and a second extension portion EX2 having a shape symmetrical to the first extension portion EX1. The extension pattern EP may be disposed between the first extension portion EXI and the second extension portion EX2. The first extension portion EXI may extend via a region overlapping one second sensing portion SP2 of the second sensing portions SP2 and be connected to the first sensing portions SP1. The second extension portion EX2 may extend via a region overlapping another second sensing portion SP2 of the second sensing portions SP2 and be connected to the first sensing portions SP1.

Hereinafter, the first sensing portions SP1 are referred to as an upper first sensing portion SP1 and a lower first sensing portion SP1 according to a relative arrangement position. In addition, the second sensing portions SP2 are referred to as a left second sensing portion SP2 and a right second sensing portion SP2 according to a relative arrangement position. Predetermined portions of the first and second extension portions EX1 and EX2 adjacent to one sides of the first and second extension portions EX1 and EX2 may be connected to the lower first sensing portion SP1 through the plurality of contact holes CH-I. For example, each of the first and second extension portions EX1 and EX2 adjacent to the one sides of the first and second extension portions EX1 and EX2 may be connected to the lower first sensing portion SP1 through two contact holes CH-I. Predetermined portions of the first and second extension portions EX1 and EX2 adjacent to other sides of the first and second extension portions EX1 and EX2 may be connected to the upper first sensing portion SP1 through the plurality of contact holes CH-I. For example, each of the first and second extension portions EX1 and EX2 adjacent to the other sides of the first and second extension portions EX1 and. EX2 may be connected to the upper first sensing portion SP1 through two contact holes CH-I.

The first extension portion EX1 may include a first sub-extension portion EX1_1 and a second sub-extension portion EX1_2 which extend in the first diagonal direction DDR1, a third sub-extension portion EX1_3 and a fourth sub-extension portion EX1 4 which extend in the second diagonal direction DDR2, a first sub-conductive pattern SCP1 which extends in the second diagonal direction DDR2, and a second sub-conductive pattern SCP2 which extends in the first diagonal direction DDR1. The first sub-extension portion EX1_1 and the second sub-extension portion EX1_2 are parallel to each other, and the third sub-extension portion EX1_3 and a fourth sub-extension portion EX1_4 are parallel to each other.

Predetermined portions of the first and second sub-extension portions EX1_1 and EX1_2 adjacent to one sides of the first and second sub-extension portions EX1_1 and EX1_2 may be connected to the lower first sensing portion SP1 through the plurality of contact holes CH-I. Predetermined portions of the third and fourth sub-extension portions EX1_3 and EX1_4 adjacent to one sides of the third and fourth sub-extension portions EX1_3 and EXI_4 may be connected to the upper first sensing portion SP1 through the plurality of contact holes CH-I.

The other side of the first sub-extension portion EX1_1 may extend from the other side of the third sub-extension portion EX1_3, and the other side of the second sub-extension portion EX1_2 may extend from the other side of the fourth sub-extension portion EX1_4. The first sub-conductive pattern SCP1 may extend from the other side of the fourth sub-extension portion EX1_4 in the second diagonal direction DDR2 and extend to the first sub-extension portion EXT_1. The first sub-conductive pattern SCP1 may be located between the first and second sub-extension portions EX1_1 and EX1_2. The second sub-conductive pattern SCP2 may extend from the other side of the second sub-extension portion EX1_2 in the first diagonal direction DDR1 and extend to the third sub-extension portion EX1_3. The second sub-conductive pattern SCP2 may be located between the third and fourth sub-extension portions EX1_3 and EX1_4.

The first sub-extension portion EX1_1, the second sub-extension portion EX1_2, the third sub-extension portion EX1_3, the fourth sub-extension portion EX1_4, the first sub-conductive pattern SCP1, and the second sub-conductive pattern SCP2 may be integrally formed.

The first and second sub-extension portions EXT_1 and EXT_2 may extend to cross a predetermined number of the second branch portions BP2 adjacent to the lower first sensing portion SP1 among the second branch portions BP2 of the right second sensing portion SP2. The first branch portions BPI of the right second sensing portion SP2 may not be disposed in a partial region overlapping the first and second sub-extension portions EX1_1 and EX1_2 and the second sub-conductive pattern SCP2, The third and fourth sub-extension portions EX1_3 and EX1_4 may extend to cross a predetermined number of the first branch portions BP1 adjacent to the upper first sensing portion SP1 among the first branch portions BP1 of the right second sensing portion SP2. The second branch portions BP2 of the right second sensing portion SP2 may not be disposed in a partial region overlapping the third and fourth sub-extension portions EX1_3 and EX1_4 and the first sub-conductive pattern SCP1.

The second extension portion EX2 may include a fifth sub-extension portion EX2_1 and a sixth sub-extension portion EX2_2 which extend in the second diagonal direction DDR2, a seventh sub-extension portion EX2_3 and a eighth sub-extension portion EX2_4 which extend in the first diagonal direction DDR1, a third sub-conductive pattern SCP3 which extends in the first diagonal direction DDR1, and a fourth sub-conductive pattern SCP4 which extends in the second diagonal direction DDR2. The left second sensing portion SP2 may have a structure symmetrical to the right second sensing portion SP2, and the second extension portion EX2 may have a structure symmetrical to the first extension portion EX1. Therefore, hereinafter, the descriptions of the fifth to eighth sub-extension portions EX2_1 to EX2_4 and the third and fourth sub-conductive patterns SCP3 and SCP4 will be omitted.

Referring to FIG. 7, a first sensing insulating layer IIL1 may be disposed on the encapsulation layer TFL. The first sensing insulating layer IIL1 may include an inorganic insulating layer. At least one first sensing insulating layer IIL1 may be provided on the encapsulation layer TFL. For example, two first sensing insulating layers MA may be sequentially stacked on the encapsulation layer TFL.

A connection pattern CP may be disposed on the first sensing insulating layer IIL1. A second sensing insulating layer IIL2 may be disposed on the connection pattern CP and the first sensing insulating layer IIL1. The second sensing insulating layer IIL2 may be disposed on the first sensing insulating layer ILL1 to cover the connection pattern CP. The second sensing insulating layer IIL2 may include an inorganic insulating layer or an organic insulating layer.

The first sensing portions SP1 and the second sensing portions SP2 may be disposed on the second sensing insulating layer IIL2. The extension pattern EP integrally formed with the second sensing portions SP2 may also be disposed on the second sensing insulating layer IIL2. The connection pattern CP may be connected to the first sensing portions SP1 through the plurality of contact holes CH-I in the second sensing insulating layer IIL2.

The sensing portions SP1 and SP2 may be referred to as a first conductive pattern CPT1. The first and second sensing portions SP1 and SP2 may be formed by the first conductive pattern CPT1. The connection pattern CP connecting the first sensing portions SP1 to each other among the first and second sensing portions SP1 and SP2 may be referred to as a second conductive pattern CPT2.

A third sensing insulating layer IIL3 may be disposed on the first and second sensing portions SP1 and SP2 and the second sensing insulating layer IIL2. The third sensing insulating layer IIL3 may be disposed on the second sensing insulating layer IIL2 to cover the first and second sensing portions SP1 and SP2. The third sensing insulating layer IIL3 may include an organic insulating layer.

FIG. 8 is a plan view illustrating a configuration of the display device according to an embodiment of the inventive concept. FIGS. 9A and 9B are cross-sectional views of a portion of the display device according to an embodiment of the inventive concept. In the display device according, to an embodiment of the inventive concept, FIG. 8 mainly illustrates the arrangement relationship on a plane of through-holes CNT provided in a connection region CNA in the non-display region NDA of the display panel and the trace lines TXL and RXL included in the input sensing unit. FIG. 9A illustrates a cross section corresponding to the line III-III' illustrated in FIG. 8. FIG. 9B illustrates a cross section corresponding to the line IV-IV' illustrated in FIG. 8.

Referring to 8 and 9A together, as described above, the display panel DP is divided into a display region DA and a non-display region NDA, and the non-display region NDA includes the connection region CNA. The connection region CNA may be a region in which the aforementioned power line PL (see FIG. 4A) is disposed. The power line PL may correspond to a voltage line VL illustrated in FIG. 9A. In an embodiment of the inventive concept, the voltage line VL may receive the second driving voltage ELVSS (see FIG. 4B).

At least one through-hole CNT may be formed in the connection region CNA. The through-hole CNT may be an opening passing through the layers disposed above the voltage line VL and exposing the upper surface of the voltage line VL. In an embodiment of the inventive concept, the through-hole CNT may have a shape in which the through-hole CNT passes through at least a portion of the sixth insulating layer IL6, the pixel defining film PDL, and the organic layer OL disposed above the voltage line VL. A portion of the voltage line VL may be exposed by the through-hole CNT, and the second electrode CE disposed on the organic layer OL may come in contact with the voltage line VL. Accordingly, the second electrode CE and the voltage line VL may be electrically connected to each other, On a plane, the connection region CNA may be adjacent to the display region DA. The connection region CNA may be defined to surround at least one side of the display region DA. For example, as illustrated in FIG. 8, the connection region CNA may surround the entire edge of the display region DA having a rectangular shape.

On a plane, the display region DA may be provided as a rectangular shape including a long side extending in the first direction DR1 and a short side extending in the second direction DR2. In an embodiment of the inventive concept, the through-hole CNT may include a first through-hole CNT1 adjacent to a short side of the display region DA on a plane and a second through-hole CNT2 adjacent to a long side of the display region DA on a plane.

The first through-hole CNT1 may have a shape extending along the second direction DR2. The first through-hole CNT1 may include a first-1 through-hole CNT1-1 and a first-2 through-hole CNT1-2 spaced apart from each other along the first direction DR1 with the display region DA interposed therebetween. The first-1 through-hole may be located below the display region DA, and the first-2 through-hole CNT1-2 may be located above the display region DA. The first-1 through-hole CNT1-1 may be adjacent to the second region AA2 (see FIG. 5) in which the pads PD (see FIG. 5) are disposed, The second through-hole CNT2 may have a shape extending along the first direction DR1 The second through-hole CNT2 may include a second-1 through-hole CNT2-1 and a second-2 through-hole CNT2-2 spaced apart from each other along the second direction DR2 with the display region DA interposed therebetween. The second-1 through-hole CNT2-1 may be located on the left side of the display region DA, and the second-2 through-hole CNT2-2 may be located on the right side of the display region DA.

At least a portion of the trace lines TXI, and included in the input sensing unit may be disposed to overlap the through-hole CNT on a plane. At least a portion of each of the first trace lines TXL and the second trace lines RXI, may be disposed to overlap the through-hole CNT.

The first trace lines TXL may be disposed to overlap the first through-hole CNT1. The first trace lines TXT may be disposed to overlap the first-1 through-hole below the display region DA. In the input sensing unit according to an embodiment of the inventive concept, the first trace lines TXL may be connected to the upper side as well as the lower side of the first sensing electrodes SE1 (see FIG. 5), and the first trace line connected to the upper side of the first sensing electrodes SE1 (see FIG. 5) may be disposed to overlap the first-2 through-hole CNT1-2.

At least a portion of the second trace lines RXL, may be disposed to overlap the second through-hole CNT2. At least a portion of the second trace lines RXL may be disposed to overlap the first through-hole CNT1. At least a portion of the second-1 trace lines RXL1 among the second trace lines RXL may overlap the second-1 through-hole CNT2-1, and at least a portion of the second-2 trace lines RXL2 may overlap the second-2 through-hole CNT2-2. At least a portion of each of the second-1 trace lines RXL1 and the second-2 trace lines RXL2 may be disposed to overlap the first-2 through-hole GNT1-2, The through-hole CNT may include a plurality of unit through-holes parallel to each other along one direction on a plane and spaced apart from each other along the one direction. In an embodiment of the inventive concept, each of the first through-hole CNT1 and the second through-hole CNT2 may include a plurality of unit through-holes. FIG. 8 illustrates that each of the first-1 through-hole CNT1-1 and the first-2 through-hole CNT1-2 includes two unit through-holes CNT1-1a, CNT1-1b, CNT1-2a, and CNT1-2b. In addition, FIG. 8 illustrates that each of the second-1 through-hole CNT2-1 and the second-2 through-hole CNT2-2 includes three unit through-holes CNT2-1a, CNT2-1b, CNT2-1c, CNT2-2a, CNT2-2b, and CNT2-2c.

However, the embodiment of the inventive concept is not limited thereto, and the number and shape of the unit through-holes may be variously changed according to the resolution, size and the like of the display device. A non-through-hole portion NCNT may be located between unit through-holes.

Referring to FIGS. 9A and 9B together, a voltage line VL is disposed in the connection region CNA. The voltage line VL may correspond to the aforementioned power line PL (see FIG. 4A). The voltage line VL may receive the second driving voltage ELVSS (see FIG. 4B). The display panel DP may include a data line DTL disposed in the non-display region NDA. The data line DTL may correspond to the first and second control lines CSL1 and CSL2 (see FIG. 4A) and the data lines DL1 to DLn (see FIG. 4A) which are described above.

Each of the voltage line VL and the data line DTL may include a conductive pattern disposed on any one of the plurality of first to ixth insulating layers IL1, 1L2, IL3, IL4, IL5, and IL6 included in the circuit element layer DP-CL (see FIG. 3). In an embodiment of the inventive concept, each of the voltage line VL and the data line DTL may include at least any one of a first conductive pattern SDI disposed on the third insulating layer IL3 or a second conductivepattern SD2 disposed on the fifth insulating layer IL5. Each of the voltage line VL and the data line DTL may further include a third conductive pattern LN disposed on the first insulating layer IL1. The first conductive pattern SDI may be disposed between the second conductive pattern SD2 and the third conductive pattern LN. As illustrated in FIGS. 9A and 9B, each of the voltage line VL and the data line DTL may have a structure including a plurality of conductive patterns disposed on a plurality of layers. However, the embodiment of the inventive concept is not limited thereto, and each of the voltage line VL and the data line DTL may include only a single conductive pattern. For example, each of the voltage line VL and the data line DTL may include only any one of the first conductive pattern SD1 and the second conductive pattern SD2.

In the display device according to an embodiment of the inventive concept, the plurality of first to sixth insulating layers IL1, IL2, IL3, IL4, IL5, and IL6 included in the circuit element layer DP-CL (see FIG. 3) and some layers of the display element layer DP-OLED (see FIG. 3) may be disposed to extend from the display region DA to the non-display region NDA. The first to fourth insulating layers IL1 to IL4 may extend to the non-display region NDA, The fifth insulating layer IL5 and the sixth insulating layer IL6 may extend to a predetermined portion of the non-display region NDA. The pixel defining film PDL may be disposed up to a portion of the non-display region NDA adjacent to the display region DA. The organic layer OL may be disposed up to a portionof the non-display region NDA adjacent to the display region DA. For example, the organic layer OL may be disposed between the first electrode AE and the second electrode CE among a plurality of layers included in the light-emitting element ED. The organic layer OL may include, for example, a hole control layer HTR and an electron control layer ETR. When the light-emitting layer EL is commonly provided to the pixels, the light-emitting layer EL may also be disposed to extend to a portion of the non-display region NDA. The second electrode CE may be disposed up to a portion of the non-display region NDA adjacent to the display region DA. As illustrated in FIGS. 9A and 9B, the end of the second. electrode CE and the end of the organic layer OL may be aligned with each other. However, the embodiment of the inventive concept is not limited thereto, and the second electrode CE may extend farther from the display region DA than the organic layer OL.

An opening overlapping the non-display region NDA may be formed in each of a portion of the plurality of first to sixth insulating layers IL1, IL2, IL3, IL4, IL5, and IL6, the pixel defining film PD1, and the organic layer OL, which extend to the non-display region NDA.

In an embodiment of the inventive concept, a first opening OL-OP may be formed in the organic layer OL, and a second opening PDL-OP may be formed in the pixel defining film PDL. A third opening IN-OP may be formed in a portion of the plurality of first to sixth insulating layers IL1, IL2, IL3, IL4, IL5, and IL6 disposed above the voltage line VL. In an embodiment of the inventive concept, the third opening IN-OP may be formed in the sixth insulating layer IL6 disposed on the second conductive pattern SD2 included in the voltage line VL.

FIG. 9A is a cross-sectional view of a portion overlapping the through-hole CNT illustrated in FIG. 8, and FIG. 9B is a cross-sectional view of a portion overlapping the non-through-hole portion NCNT illustrated in FIG. 8, As illustrated in FIG. 9A, the through-hole CNT may correspond to the first opening OL-OP in the organic layer OL, the second opening PDL-OP in the pixel defining film PDL, and the third opening IN-OP in the sixth insulating layer IL6. In other words, the through-hole CNT may be a combination of the first opening OL-OP, the second opening PDL-OP, and the third opening IN-OP. The inner side surface of each of the first opening OL-OP, the second opening PDL-OP, and the third opening IN-OP may be aligned with each other to define one through-hole CNT.

A first darn DAM1 and a second dam DAM2 spaced apart from each other may be disposed in the non-display region NDA. The first and second dams DAM1 and DAM2 may be disposed on the fifth insulating layer IL5. The first and second dams DAM1 and DAM2 may also be disposed on the sixth insulating layer IL6. The first dam DAM1 may be adjacent to the display region DA, and the second dam DAM2 may be farther away from the display region DA than the first dam DAM1. Each of the first and second dams DAM1 and DAN2 may include a plurality of layers stacked on each other. The height of the second dam DAM2 may be greater than the height of the first dam DAM1.

The encapsulation layer TFL covering the light-emitting element ED may extend to the non-display region NBA and be disposed on the first and second dams DAM1 and DAM2, The encapsulation layer TFL may include first to third encapsulation layers EN1, EN2, and EN3. The first encapsulation layer EN1 may extend toward the non-display region NDA and be disposed on the first and second dams DAM1 and DAM2. The second encapsulation layer EN2 may be disposed up to the non-display region NDA adjacent to the display region DA. The second encapsulation layer EN2 may be disposed up to the first darn DAM1. The third encapsulation layer EN3 may cover the second encapsulation layer EN2 and be disposed directly on a portion of the first encapsulation layer ENI near the first dam DAM1

The second encapsulation layer EN2 may contain an organic material. The second encapsulation layer EN2 may be formed of an organic material having fluidity. Even though the organic material having fluidity flows toward the non-display region NDA, the organic material may be blocked by the first darn DAM1. The second darn DANE may further block the organic material which overflows the first darn DAM1. The first encapsulation layer EN1 and the third encapsulation layer ENS may contain an inorganic material, As described above, at least a portion of the trace lines may be disposed to overlap the through-hole CNT on a plane. As illustrated in FIG. 9A, a portion of the second trace line RXL, may be disposed to overlap the through-hole CNT on a plane, As illustrated in FIG. 9B, in the non-through-hole portion NCNT (see FIG. 8) in which the through-hole CNT is not provided, the second trace line RXL may be disposed to at least partially overlap the voltage line VL. FIGS. 9A and 9B illustrate shapes in which the second trace line RXL is disposed on a cross section, but the embodiment of the inventive concept is not limited thereto, and the same description may be applied to the first trace line TXL described in FIG. 8, FIG. 10 is a cross-sectional view of a portion of the display device according to an embodiment of the inventive concept, FIG. 10 more simply illustrates the shape in which the second electrode CE and the voltage line VL are electrically connected to each other through the through-hole CNT on the cross section illustrated in FIG. 9A. In FIG. 10, some configrurations on the cross section illustrated in FIG. 9A are omitted for the convenience of explanation.

Referring to FIG. 10, as described above, some layers included in the circuit element layer DP-CL (see FIG. 3) and the display element layer DP-OLED (see FIG. 3) may be disposed to extend from the display region DA to the non-display region NDA. As illustrated in FIG. 10, an upper insulating layer INL-U, a pixel defining film PDL, and an organic layer OL may be disposed to extend from the display region DA to the non-display region NDA. In this specification, the upper insulating layer INL-U may be a layer disposed above the voltage line VL among the plurality of insulating layers included in the circuit element layer DP-CL (see FIG. 3). The upper insulating layer INL-U may be, for example, the sixth insulating layer IL6 illustrated in FIG. 9A. The organic layer OL may include the hole control layer (see FIG. 9A) and the electron control layer ETR (see FIG. 9A) among the components included in the aforementioned light-emitting element ED (see FIG. 9A), A first opening OL-OP may be formed in the organic layer OL. The organic layer OK may include a first portion OLI disposed in the display region DA and a second portion OL2 disposed in the non-display region NDA. The first opening OL-OP may be formed in the second portion OL2 disposed in the non-display region NDA. The first opening OL-OP may be formed in the second portion OL2 to correspond to the connection region CNA in which the voltage line VL is disposed.

A second opening PDL-OP may be formed in the pixel defining film PDL. A third opening IN-OP may be formed in the upper insulating layer Each of the second opening PDL-OP and the third opening IN-OP may correspond to the first opening OL-OP. The through-hole CNT may correspond to the first opening OL-OP in the organic layer OL, the second opening PDL-OP in the pixel defining film PDL, and the third opening IN-OP in the upper insulating layer INL-U. In other words, the through-hole CNT may be a combination of the first opening OL-OP, the second opening PDL-OP, and the third opening IN-OP. The inner side surface of each of the first opening OL-OP, the second opening PDL-OP, and the third opening IN-OP may be aligned with each other to define one through-hole CAT.

At least a portion of the trace line XL may overlap the through-hole CNT on a plane. The trace line XL may include the first trace line TXL (see FIG. 8) and the second trace line RXL (see FIG. 8), which are described above, In addition, the trace line: XL may correspond to the aforementioned second sensing conductive layer ICL2 (see FIG. 3) and be covered with the third sensing insulating layer IIL3.

As described above, the display panel DP may include the voltage line VL and the data line DTL, and at least a portion of the upper surface of the voltage line VL may be exposed by, the through-hole CNT. The second electrode CE may come in contact with the upper surface of the voltage line VL through the through-hole CNT. For example, the second electrode CE may be in direct contact with the voltage line VL at the bottom of the through-hole CNT. Accordingly, the second electrode CE and the voltage line VL may be electrically connected to each other. A portion of the second electrode CE may be disposed inside each of the first opening OL-OP, the second opening PDL-OP, and the third opening IN-OP.

A separate through-hole may not be provided above the data line DTL. The voltage line VL may have a first width dl in one direction, and the first width d1 may be greater than a second width d2, which is the width of the data line DTL in the one direction.

With respect to the organic layer OL included in the light-emitting element ED in the display device according to an embodiment of the inventive concept, a through-hole CNT may be formed to overlap a portion of the organic layer OL disposed in the non-display region NDA, and this way, the second electrode CE may be electrically connected to the voltage line VL so that the driving voltage ELVSS may be transmitted to the light-emitting element ED. In the display device according to an embodiment of the inventive concept, since the second electrode CE and the voltage line VL are connected to each other through the through-hole CNT in the region in which the organic layer OL of the light-emitting element ED is disposed, the dead space of the display device may be reduced.

When a through-hole is not formed in the organic layer, a connection portion between the second electrode and the voltage line is formed beyond a shadow portion of the organic layer which is formed through a deposition process or the like, and therefore, the area of the non-display region required to form the connection portion will increase. In the display device according to an embodiment of the inventive concept, since the connection portion between the second electrode CE and the voltage line VL is formed through the through-hole CNT formed to overlap a portion of the organic layer OL, the area required to form the connection portion is reduced, thereby making it possible to reduce the dead space of the display device.

In addition, in the display device according to an embodiment of the inventive concept, since the trace line TXURXT included in the input sensing unit ISP is disposed to overlap the through-hole CNT formed to overlap a portion of the organic layer OL, it is possible to improve the stability of a signal transmitted through the trace line TXL/RXL, thereby improving the sensing performance of the input sensing unit ISP. More specifically, since the second electrode CE and the voltage line VL are connected in a portion overlapping the through-hole CNT the thickness of the conductive pattern configured to receive a voltage is improved, thus making it possible to improve the effect of shielding the trace line TXL/RXL, which is disposed to overlap the through-hole CNT, from electric fields generated in other configurations. Accordingly, it is possible to improve the stability of a signal transmitted through the trace line TXL/RXL, thus improving the sensing performance of the input sensing unit ISP.

FIGS. 11A and 11B are plan views illustrating a partial configuration of a display device according to an embodiment of the inventive concept. FIGS. 11A and 11B illustrate a partial configuration of the display device according to the embodiment of the inventive concept illustrated in FIG. 8 and a display device according to another embodiment of the inventive concept. When compared to the display device illustrated in FIG. 8, FIGS. 11A and 11B illustrate a display device according to an embodiment of the inventive concept in which the shape of the through-hole CNT formed on a plane is different from that of FIG. 8.

Referring to FIG. 11A, unlike the embodiment of the inventive concept illustrated in FIG. 8, in the display device according to an embodiment of the inventive concept, the first through-hole CNT1 may be omitted and only the second through-hole CNT2 may be provided. In other words, the display device according to an embodiment of the inventive concept may include the second through-hole CNT2 adjacent to a long side of the display region DA on a plane. Further, unlike the illustration in FIG. 11A, in the display device according to an embodiment of the inventive concept, the second through-hole CNT2 may be omitted and only the first through-hole CNT1 may be provided.

Referring to FIG. 11B, unlike the embodiment illustrated in FIG. 8, only a portion of the first through-hole CNT1 and a portion of the second through-hole CNT2 may be provided in the display device according to an embodiment of the inventive concept. In other words, on a plane, the display device according to an embodiment of the inventive concept may include the first-1 through-hole CNT1-1 adjacent to the lower side of the display region DA and the second-2 through-hole CNT2-2 adjacent to the right side of the display region DA. Further, without being limited to the embodiment of the inventive concept illustrated in FIG. 11B, the display device according to an embodiment of the inventive concept may include any one of the first-1 through-hole CNT1-1 and the first-2 through-hole CNU1-2 and any one of the second-1 through-hole CNT2-1 and the second-2 through-hole CNT2-2. In the display device according to an embodiment of the inventive concept, the planar shape and number of the through-holes CNT may be variously designed and changed according to the resolution, size, and the like of the display device.

FIGS. 12A and 12B are plan views illustrating some steps of a method of manufacturing a display device according to an embodiment of the inventive concept. FIGS. 12A and 12B schematically illustrate a step of forming the through-hole CNT (see FIG. 8) in a method of manufacturing the display device according to an embodiment of the inventive concept.

A method of manufacturing the display device according to an embodiment of the inventive concept includes forming a display panel and forming an input sensing unit, wherein the forming of the display panel includes forming a circuit element layer and forming a display element layer. The forming of the display element layer includes forming a first opening in an organic layer included in the light-emitting element. As described above in FIGS. 9A, 10, and the like, the first opening OL-OP may correspond to the through-hole CNT. In other words, the forming of the through-hole CNT (see FIG. 8) illustrated in FIGS. 12A and 12B may correspond to the forming of the first opening OL-OP.

Referring to FIGS. 8, 12A, and 12B together, the forming of the through-hole CNT is performed through a laser drilling process. In other words, the forming of the through-hole CNT may be performed through a process of irradiating laser beams LS1 and LS2 onto preset preliminary regions P-CNT1 and P-CNT2 to form a hole.

In the method of manufacturing the display device according to an embodiment of the inventive concept, the preliminary regions P-CNT1 and P-CNT2 may include a first preliminary region P-CNT1 extending along the second direction DR2 and a second preliminary region P-CNT2 extending along the first direction DR1. The first preliminary region P-CNT1 may be a region in which the first through-hole CNT1 is formed through a laser drilling process. The second preliminary region P-CNT2 may be a region in which the second through-hole CNT2 is formed through a laser drilling process The forming of the through-hole CNT may include moving and irradiating a first laser beam LS1 in the first direction DR1 as illustrated in FIG. 12A and moving and irradiating a second laser beam LS2 in the second direction DR2 as illustrated in FIG. 12B. In other words, in the method of manufacturing the display device according to an embodiment of the inventive concept, the display region DA may have a rectangular shape including sides extending in each of the first and second directions DR1 and DR2, and the method may include moving and irradiating two different laser beams LS1 and LS2 in each of the first and second directions DR1 and DR2. Accordingly, since the laser drilling process may be performed only in each of the first and second directions DR1 and DR2 crossing each other without having to change the direction in which the laser beams LS1 and LS2 travel, the time and cost required for the process of manufacturing the display device may be reduced.

In the display device according to an embodiment of the inventive concept, a connection portion between the common electrode and the voltage line is formed through the through-hole formed in a portion of the organic layer included in the light-emitting element, and therefore, the area required to form the connection portion may be reduced, thereby making it possible to provide the display device having a reduced dead space and the method of manufacturing the same.

Although the above has been described with reference to embodiments of the inventive concept, those skilled in the art or those of ordinary skill in the art will understand that various modifications and changes can be made to the inventive concept within the scope and technical field of the inventive concept described herein and set forth in the claims. Accordingly, the technical scope of the inventive concept should not he limited to the content described in the detailed description of the specification.

What is claimed is:
1. A display device, comprising:
a display panel including a display region and a non-display region adjacent to the display region; and
an input sensing unit disposed on the display panel and including an active region overlapping the display region and a peripheral region overlapping the non-display region,
wherein the display panel comprises: a base layer; a circuit element layer disposed on the base layer and comprising a plurality of insulating layers and a voltage line disposed on any one of the plurality of insulating layers; and a display element layer comprising a pixel defining film and a light-emitting element,
wherein the light-emitting element comprises: a first electrode; a second electrode opposite to the first electrode; and at least one organic layer disposed between the first electrode and the second electrode,
wherein the at least one organic layer comprises: a first portion overlapping the display region; and a second portion at least partially overlapping the non-display region,
wherein the non-display region comprises a connection region in which the voltage line is disposed,
a first opening is formed in the second portion, the second electrode and the voltage line are directly connected to each other through the first opening, and at least one first trace line of a plurality of first trace lines overlaps a part of the voltage line at the bottom of a through-hole on a plane, the through-hole overlapping the first opening is formed in the connection region; and at least some of the plurality of first trace lines overlap the through-hole;

wherein the input sensing unit comprises: a plurality of sensing electrodes overlapping the active region; and the plurality of first trace lines are connected to some of the plurality of sensing electrodes and are partially overlapping the active region, wherein at least some of the plurality of first trace lines overlap the first opening on a plane.

2. The display device of claim 1, wherein:

the display region comprises a first side extending along a first direction and a second side extending along a second direction crossing the first direction;

the plurality of sensing electrodes comprise a first sensing electrode extending along the first direction and a second sensing electrode extending along the second direction; and the plurality of first trace lines are connected to the first sensing electrode.

3. The display device of claim 2, wherein the input sensing unit further comprises a plurality of second trace lines connected to the second sensing electrode, wherein at least some of the plurality of second trace lines overlap the first opening.

4. The display device of claim 1, wherein the through-hole comprises:

a first through-hole adjacent to the first side on a plane; and a second through-hole adjacent to the second side on a plane.

5. The display device of claim 4, wherein:

the first through-hole comprises a first-1 through-hole and a first-2 through-hole spaced apart from each other along the first direction with the display region interposed therebetween; and each of the plurality of first trace lines and the plurality of second trace lines overlaps at least any one of the first-1 through-hole or the first-2 through-hole.

6. The display device of claim 4, wherein:

the second through-hole comprises a second-1 through-hole and a second-2 through-hole spaced apart from each other along the second direction with the display region interposed therebetween; and the plurality of second trace lines comprise a second-1 trace line overlapping the second-1 through-hole and a second-2 trace line overlapping the second-2 through-hole.

7. The display device of claim 1, wherein the through-hole comprises a plurality of unit through-holes spaced apart from each other on a plane.

8. The display device of claim 1, wherein:

a second opening corresponding to the first opening is formed in the pixel defining film; and the second electrode is disposed in the second opening.

9. The display device of claim 8, wherein:

the plurality of insulating layers comprise an upper insulating layer disposed on the voltage line;

a third opening corresponding to the first opening and the second opening is formed in the upper insulating layer; and the second electrode is disposed in the third opening.

10. The display device of claim 1, wherein:

the circuit element layer further comprises a data line disposed on any one of the plurality of insulating layers; and the width of the voltage line is greater than the width of the data line.

11. The display device of claim 1, wherein:

the display panel further comprises an encapsulation layer covering the light-emitting element; and the input sensing unit is disposed directly on the encapsulation layer.

12. The display device of claim 1, wherein the at least one organic layer comprises:

a hole control layer disposed on the first electrode;

a light-emitting layer disposed on the hole control layer; and an electron control layer disposed on the light-emitting layer, wherein at least a portion of the hole control layer and the electron control layer overlaps the non-display region.

13. A display device, comprising:

a display panel including a display region and a non-display region adjacent to the display region; and an input sensing unit disposed on the display panel and including an active region overlapping the display region and a peripheral region overlapping the non-display region, wherein the display panel comprises:

a base layer; a circuit element layer disposed on the base layer and comprising a plurality of insulating layers and a voltage line disposed on any one of the plurality of insulating layers; and a display element layer comprising a pixel defining film and a light-emitting element, wherein the light-emitting element comprises: a first electrode; a second electrode opposite to the first electrode; and at least one organic layer disposed between the first electrode and the second electrode, wherein:

the non-display region comprises a connection region in which the voltage line is disposed;

a first opening overlapping the connection region is formed in the at least one organic layer;

the second electrode and the voltage line are directly connected through the first opening; and a portion of the voltage line at the bottom of a though-hole is overlapped by at least one first trace line of a plurality of first trace lines on a plane, the through-hole overlapping the first opening is formed in the connection region, and at least some of the plurality of first trace lines overlap the through-hole;

wherein the input sensing unit comprises: a plurality of sensing electrodes overlapping the active region; and the plurality of first trace lines are connected to some of the plurality of sensing electrodes and are partially overlapping the active region, wherein at least some of the plurality of first trace lines overlap the first opening on a plane.

14. The display device of claim 13, wherein:

a second opening corresponding to the first opening is formed in the pixel defining film, and the second electrode is disposed in the second opening.

15. The display device of claim 14, wherein:

the plurality of insulating layers comprise an upper insulating layer disposed on the voltage line;

a third opening corresponding to the first opening and the second opening is formed in the upper insulating layer; and the second electrode is disposed in the third opening.

16. A method for manufacturing a display device, the method comprising:
- forming a display panel that includes a display region and a non-display region; and
- forming an input sensing unit that includes an active region overlapping the display region and a peripheral region overlapping the non-display region on the display panel,
- wherein the forming of the display panel comprises:
- forming a circuit element layer comprising a plurality of insulating layers above a base layer and a voltage line disposed on any one of the plurality of insulating layers; and
- forming a display element layer comprising a pixel defining film and a light-emitting element on the circuit element layer,
- wherein the light-emitting element comprises a first electrode, a second electrode opposite to the first electrode, and at least one organic layer disposed between the first electrode and the second electrode; and
- the forming of the display element layer comprises forming a first opening on the organic layer in the non-display region through a laser drilling process to directly connect the second electrode and the voltage line to each other,
- wherein a portion of the voltage line at the bottom of a through-hole is overlapped by at least one first trace line of a plurality of first trace lines on a plane, the non-display region comprises a connection region in which the voltage line is disposed, the through-hole overlapping the first opening is formed in the connection region, and at least some of the plurality of first trace lines overlap the through-hole;
- wherein the input sensing unit comprises: a plurality of sensing electrodes overlapping the active region; and the plurality of first trace lines are connected to some of the plurality of sensing electrodes and are partially overlapping the active region, wherein at least some of the plurality of first trace lines overlap the first opening on a plane.

17. The method of claim 16, wherein:
- the display region comprises a first side extending along a first direction and a second side extending along a second direction crossing the first direction; and
- the forming of the first opening comprises moving and irradiating a first laser beam in the first direction, and moving and irradiating a second laser beam in the second direction.

18. The method of claim 16, wherein:
- in the forming of the first opening, the laser drilling process is performed in the connection region.

* * * * *